United States Patent
Ma et al.

(10) Patent No.: US 11,392,128 B1
(45) Date of Patent: Jul. 19, 2022

(54) VEHICLE CONTROL USING DIRECTED GRAPHS

(71) Applicant: Zoox, Inc., Foster City, CA (US)

(72) Inventors: Lichao Ma, Santa Clara, CA (US); Joona Markus Petteri Kiiski, Cupertino, CA (US)

(73) Assignee: Zoox, Inc., Foster City, CA (US)

( * ) Notice: Subject to any disclaimer, the term of this patent is extended or adjusted under 35 U.S.C. 154(b) by 283 days.

(21) Appl. No.: 16/389,508

(22) Filed: Apr. 19, 2019

(51) Int. Cl.
 *G05D 1/02* (2020.01)
 *G06F 16/901* (2019.01)
 *G05D 1/00* (2006.01)
 *G06F 30/15* (2020.01)

(52) U.S. Cl.
 CPC ......... *G05D 1/0212* (2013.01); *G05D 1/0088* (2013.01); *G06F 16/9024* (2019.01); *G06F 16/9027* (2019.01); *G06F 30/15* (2020.01); *G05D 2201/0213* (2013.01)

(58) Field of Classification Search
 CPC ..... G08G 1/166; G08G 1/167; B60W 60/001; B60W 60/0011; B60W 60/00274; B60W 60/0027; B60W 60/00272; B60W 60/00276; G05D 1/0088; G01C 21/3446; G01C 21/3658
 See application file for complete search history.

(56) References Cited

U.S. PATENT DOCUMENTS

| | | | | |
|---|---|---|---|---|
| 6,477,515 B1 * | 11/2002 | Boroujerdi | ............. | G06Q 10/04 701/120 |
| 10,008,110 B1 * | 6/2018 | Herlocker | ............. | G08G 1/0129 |
| 2003/0229441 A1 | 12/2003 | Pechatnikov et al. | | |
| 2012/0310516 A1 | 12/2012 | Zeng | | |
| 2012/0330540 A1 * | 12/2012 | Ozaki | ............. | G06Q 50/30 701/117 |
| 2017/0016734 A1 * | 1/2017 | Gupta | ............. | G01C 21/3697 |
| 2020/0139964 A1 * | 5/2020 | Kuninobu | ............. | G05D 1/0027 |

(Continued)

FOREIGN PATENT DOCUMENTS

| | | | |
|---|---|---|---|
| CN | 110789520 A | * | 2/2020 |
| JP | 2019204297 A | * | 11/2019 |

OTHER PUBLICATIONS

Kmiotek, et al., "Multisensor Fusion Based Tracking of Coalescing Objects in Urban Environment for an Autonomous Vehicle Navigation", 2008 IEEE International Conference on Multisensor Fusion and Integrationfor Intelligent Systems, IEEE, Aug. 2008, pp. 52-57.

(Continued)

*Primary Examiner* — Kenneth J Malkowski
(74) *Attorney, Agent, or Firm* — Lee & Hayes, P.C.

(57) ABSTRACT

Controlling autonomous vehicles requires accurate information about how entities behave in an environment with respect to one another. In an example, a data structure is used to associate entities in an environment of the vehicle with the vehicle and/or with each other. For example, associations between entities can be based on locations of the entities relative to each other and/or relative to segments of a drivable surface. Information about associations between the vehicle and/or entities in the environment may be used to identify entities that may influence travel of the vehicle and/or other entities and, in some implementations, vehicle controls can be generated based on these relevant entities.

20 Claims, 10 Drawing Sheets

(56) References Cited

U.S. PATENT DOCUMENTS

2020/0249041 A1* 8/2020 Begleiter ................ G01S 19/48
2020/0307599 A1* 10/2020 Oka ................ B60W 60/00276
2020/0398847 A1* 12/2020 Fang ........................ G08G 1/16

OTHER PUBLICATIONS

Nimmagadda, "Building an Autonomous Ground Traffic System" Technical Report HR-09-09, The University of Texas at Austin, 2009, pp. 1-27.

Paden et al., "A Survey of Motion Planning and Control Techniques for Self-Driving Urban Vehicles", IEEE Transactions on Intelligent Vehicles, vol. 1, No. 1, Mar. 2016, pp. 33-55.

Zhu, et al., "Evaluating Location Compliance Approaches for Automated Road Vehicles", 2018 IEEE Intelligent Vehicles Symposium ( IV), IEEE, 2018, Jun. 2018, pp. 642-649.

* cited by examiner

VEHICLE CONTROL USING DIRECTED GRAPHS

BACKGROUND

Planning systems in vehicles, e.g., autonomous vehicles, use information associated with objects in an environment (e.g., dynamic agents, static agents) and drivable surface information (e.g., extents of the drivable surface, lanes in the drivable surface, directions-of-travel) to determine actions for navigating through the environment. However, in more complex driving environments, e.g., in which multiple objects may impact travel, it may be difficult to determine accurate commands for the vehicle to traverse the environment. For instance, as the vehicle considers more objects, the cost of computation increases, which can impact decision making at the vehicle.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
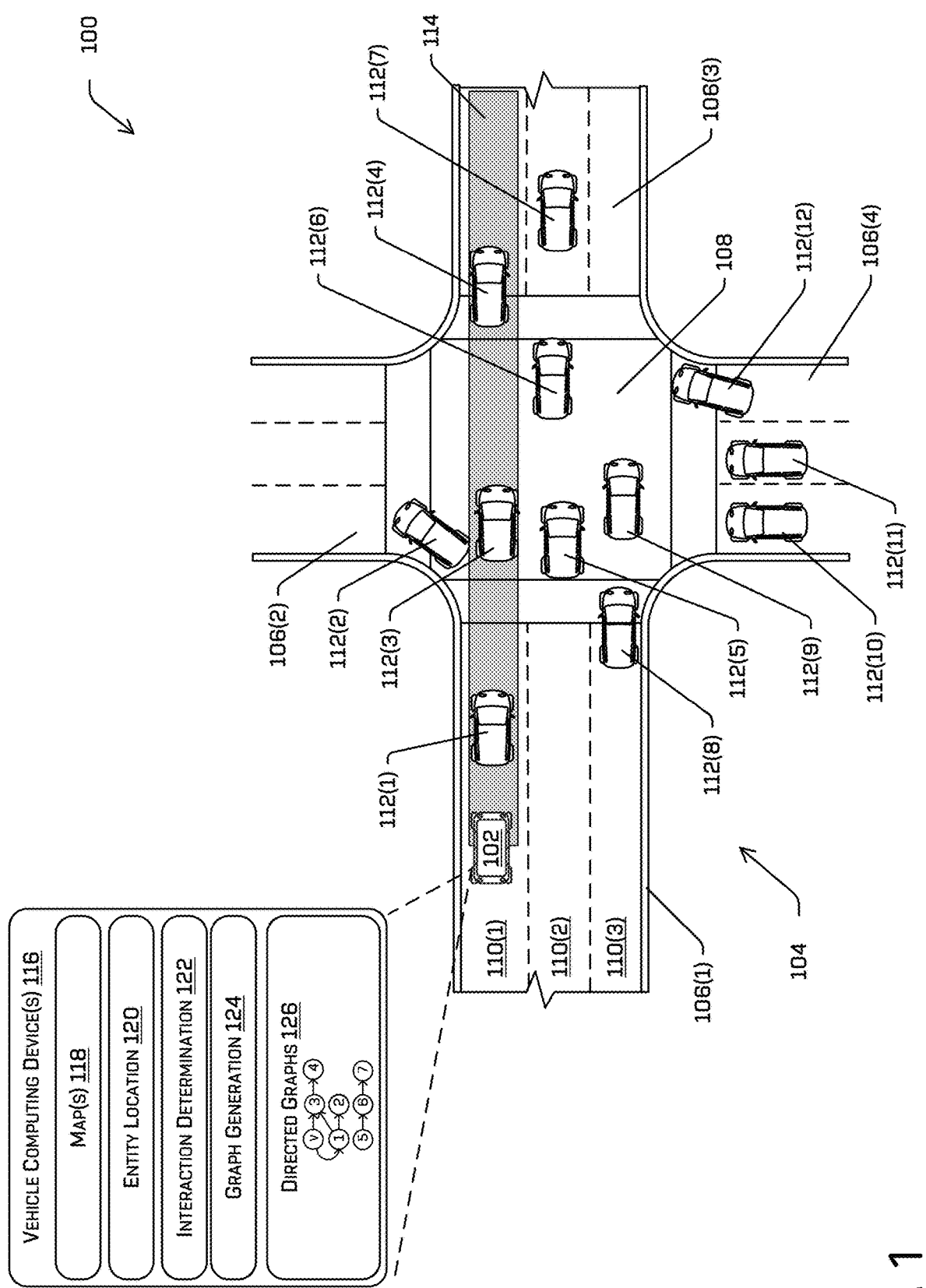
FIG. 1 is a schematic diagram illustrating an example implementation for vehicle control using directed graphs in an environment, according to aspects of this disclosure.

Techniques described herein are directed to control of a vehicle, such as an autonomous vehicle, in a mapped environment. In some such techniques, complex multi-entity interactions may be determined for control of the autonomous vehicle. For example, in implementations described herein, a control (such as an acceleration, steering angle, torque, etc.) of a vehicle along a planned path relative to a number of entities in the environment (e.g., other vehicles on the road) may be determined using a directed graph indicative of the entities. For example, using the directed graph, a computing system associated with the vehicle can more readily identify entities that are relevant to the vehicle's travel and/or more efficiently model behaviors of the vehicle and/or the entities (e.g., incorporating information on how the one or more entities may react to one another in an environment).

As a non-limiting example, a computing device of an autonomous vehicle may receive sensor information, e.g., from a sensor on the vehicle, indicative of positions of additional vehicles on the road, e.g., relative to the vehicle. The computing device may also receive map data of the surrounding environment. Using the map data and the position information, the computing device can determine a location of each of the entities in the map. For example, the vehicle computing device may determine a portion of a road network, e.g., a road segment, an intersection, a traffic lane, in which each entity is located. Then, based on the locations and rules associated with those locations, e.g., lawful direction of travel, turning/non-turning lanes, or the like, the computing device may determine associations between vehicles. In implementations described herein, these associations in may be represented as connected nodes in a data structure, e.g., one or more directed graphs. As described herein, the computing device can access the directed graph(s) to more efficiently (e.g., more quickly and/or with reduced computing resources) predict entity behaviors, model vehicle planning, and/or generate vehicle controls.

Aspects of this disclosure may be used to identify positions of entities in a mapped region. Based on this position data, the techniques described herein can identify those entities that may impact travel of the autonomous vehicle, and plan future behaviors based on those entities, e.g., at the exclusion of other entities. Moreover, by identifying relationships of entities, the techniques described herein may generate more realistic predictions of entities that can affect the vehicle's travel. As a non-limiting example, consider two vehicles following one another. In such an example, by modeling vehicle behavior based on one vehicle following the other, additional constraints may be placed on the following vehicle (e.g., can have a maximum velocity of the lead vehicle, is limited based on a distance to the lead vehicle, etc.). Such unique position determination techniques and entity relationship determination techniques may provide for improved control with respect to objects, as opposed to conventional systems. The techniques described herein may result in a smoother ride for passengers, lawful operation, and increased safety for the autonomous vehicle and/or objects in the environment.

Techniques described herein may provide a technological improvement over existing prediction and navigation technology. In addition to improving the accuracy with which sensor data can be used to determine entity locations in the environment, techniques described herein can provide a smoother ride and improve safety outcomes by, for example, more accurately determining safe driving maneuvers to be implemented by the vehicle to reach an intended destination. Techniques described herein may also reduce component wear and energy requirements associated with the vehicle.

For example, existing techniques may more harshly brake and/or accelerate, putting additional and unnecessary stress on vehicle components.

FIGS. 1-9 provide additional details associated with techniques described herein.

FIG. 1 is a schematic diagram illustrating an example implementation of control of a vehicle in an environment using directed graphs. More specifically, FIG. 1 illustrates an example environment 100 in which a vehicle 102 is operating. In the illustrated example, the vehicle 102 is driving on a road 104 in the environment 100, although in other examples the vehicle 102 may be stationary and/or parked in the environment 100. In the example, the road 104 includes a first road segment 106(1), a second road segment 106(2), a third road segment 106(3), and a fourth road segment 106(4) (collectively, the road segments 106) meeting at an intersection or junction 108. In the illustrated example, the first road segment 106(1) and the second third road segment 106(3) include a first lane 110(1), a second lane 110(2), and a third lane 110(3) (collectively, the lanes 110). In the illustrated example, each of the lanes 110 is configured for driving in a same direction e.g., left to right in the illustration. Lanes of the second road segment 106(2) and the fourth road segment 106(4) also are configured for driving in a same direction, e.g., bottom to top in the illustration. Thus, the junction 108 is an intersection of two three-lane, one-way roads. In the scenario illustrated in FIG. 1, a number of additional vehicles also are traveling on the road 104. Specifically, the environment 100 includes a first additional vehicle 112(1), a second additional vehicle 112(2), a third additional vehicle 112(3), and so forth (collectively, the additional vehicles 112). Although FIG. 1 illustrates only the additional vehicles 112 as entities traveling on the road 104, many other types of entities, including, but not limited to, buses, bicyclists, pedestrians, motorcyclists, or the like may also or alternatively be traveling on the road 104.

As illustrated and described, the road 104 can include several entities, each capable of behaving in a number of ways. In some conventional examples, a computing system associated with the autonomous vehicle 102 may predict a likely trajectory for each of the additional vehicles 112, as well as for any or all other entities (e.g., pedestrians) that could impact travel on the road 104. However, because the autonomous vehicle 102 reacts in real time or near-real time, computational resources associated with the vehicle may be limited. As a result, in those conventional examples, modeling of the behavior of the additional vehicles 112 may be relatively simplistic. For instance, previous techniques may have included ascribing a same, predetermined velocity to each sensed entity or determining a per-vehicle velocity based solely on attributes of the vehicle. However, such simplistic modeling may not accurately reflect the realities of the environment 100. In an example using FIG. 1, the autonomous vehicle 102 may travel to a destination via a drive path 114. In the illustrated example, the drive path 114 has the vehicle remaining in the first lane 110(1) through the intersection 106. In a conventional example, the autonomous vehicle 102 may determine that each of the additional vehicles 112(1)-112(9) will travel in a current heading at a predetermined velocity and/or acceleration. For example, such acceleration and/or velocity may be based on a speed limit of the road 104. However, in actuality, the third additional vehicle 112(3) may be unable to clear the intersection represented by the junction 106, e.g., because the fourth additional vehicle 112(4) has unexpectedly come to a stop or otherwise slowed down. In such an example, because the autonomous vehicle 102 believes that the third additional vehicle 112(3) and the fourth additional vehicle 112(4) will have cleared the intersection, the autonomous vehicle 102 may enter the intersection. However, once in the intersection, the autonomous vehicle 102 not be able to exit, thereby blocking the intersection 108.

Techniques described herein may provide improvements to navigating the scenario illustrated in FIG. 1 as well as other scenarios. More specifically, in examples described herein, the autonomous vehicle 102 may include one or more vehicle computing device(s) 116 that can generate associations between the autonomous vehicle 102 and the additional vehicles 112 and/or among the additional vehicles 112. In some examples, the associations can be leveraged to better predict activities of the additional vehicles 112. Thus, in the example of FIG. 1, the autonomous vehicle 102 may access a directed graph or other data structure that indicates that the third additional vehicle 112(3) is following or otherwise associated with the fourth additional vehicle 112(4). Accordingly, motion of the third additional vehicle 112(3) may be dependent upon motion of the fourth additional vehicle 112(4). Similarly, the first additional vehicle 112(1) may be following the third additional vehicle 112(3) and, therefore, motion of the first additional vehicle 112(1) may be in part based on the behavior of the third additional vehicle 112(3). Accordingly, each of the first additional vehicle 112(1), the third additional vehicle 112(3), and the fourth additional vehicle 112(4) may ultimately impact travel of the autonomous vehicle 102 in the drive path 114. In some examples, using these associations, the vehicle computing device 116 can better predict behaviors of the respective additional vehicles 112, thereby improving planning and control of the autonomous vehicle 102.

In some examples described further herein, the association of the vehicles may also allow for identification of entities relevant to travel of the autonomous vehicle 102. Thus, while conventional vehicle computing systems may have predicted behaviors of all entities on the road 104, e.g., each of the additional vehicles 112, by creating associations between vehicles, e.g., via a directed graph or data structure, certain vehicles that will not impact travel of the autonomous vehicle 102 may be disregarded when planning travel along the drive path 114. By eliminating some of the entities from prediction (or other) computations, the vehicle computing device 116 may have additional computing resources to perform the more-detailed prediction described above.

In more detail, and as illustrated in FIG. 1, the vehicle computing device(s) 116 can include or have access to one or map(s) 118. Moreover, the vehicle computing device(s) 116 may include an entity location component 120, an interaction determination component 122, and a graph generation component 124.

In some examples, the map(s) 118 can include detailed maps such as a type used by one or more autonomous vehicles, such as the vehicle 102, to travel in an area, for example, utilizing simultaneous localization and mapping (SLAM) techniques. The map(s) 118 may include one or more 2D maps of a road network on which the vehicle 102 is capable of driving autonomously. In some implementations, the map(s) 118 can include a 3D mesh of an environment, including a drivable surface. The map(s) 118 may also include information about aspects of the drivable surface, including but not limited to extents of the drivable surface, road marking information, traffic control information, or the like.

Figure 6:
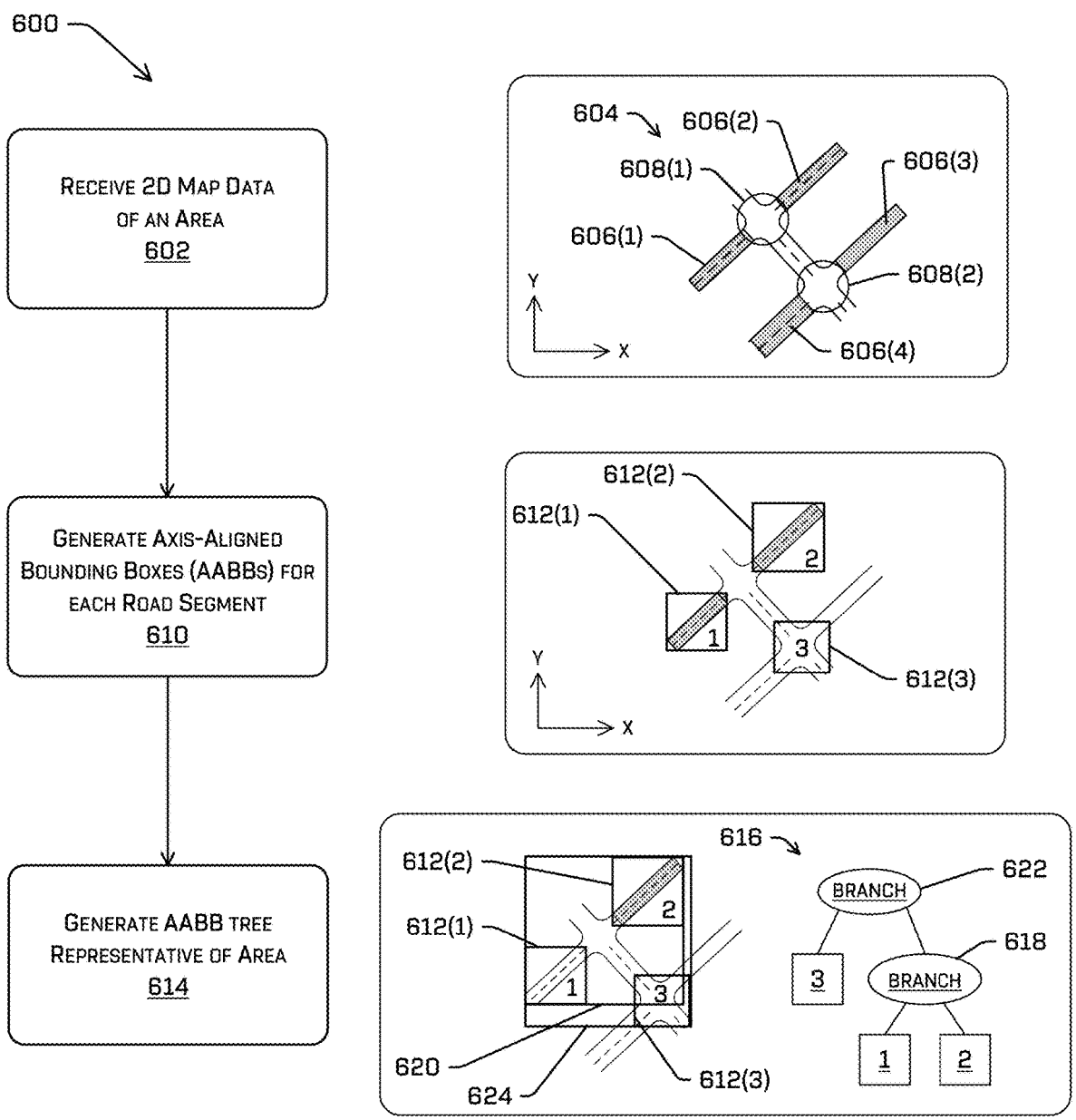
FIG. 6 includes textual and visual flowcharts to illustrate an example method of locating a position of an entity in a mapped environment, according to aspects of this disclosure.
Figure 7:
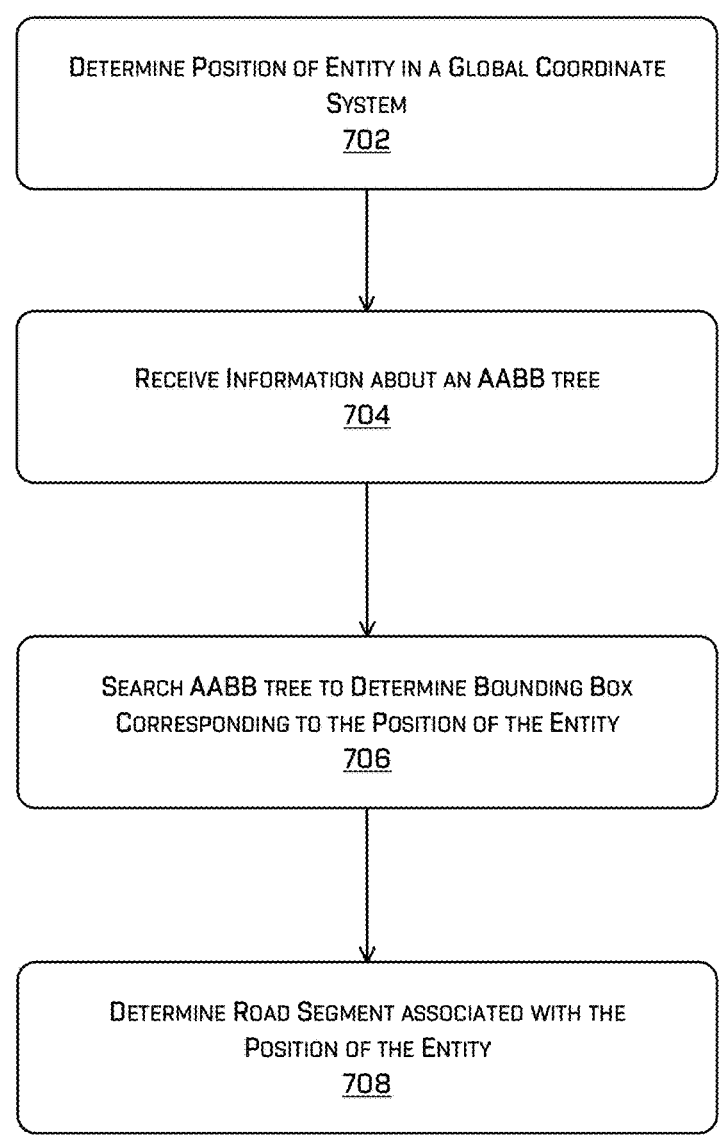
FIG. 7 is a flow chart representative of a process for locating a position of an entity in a mapped environment, according to aspects of this disclosure.
Figure 8:
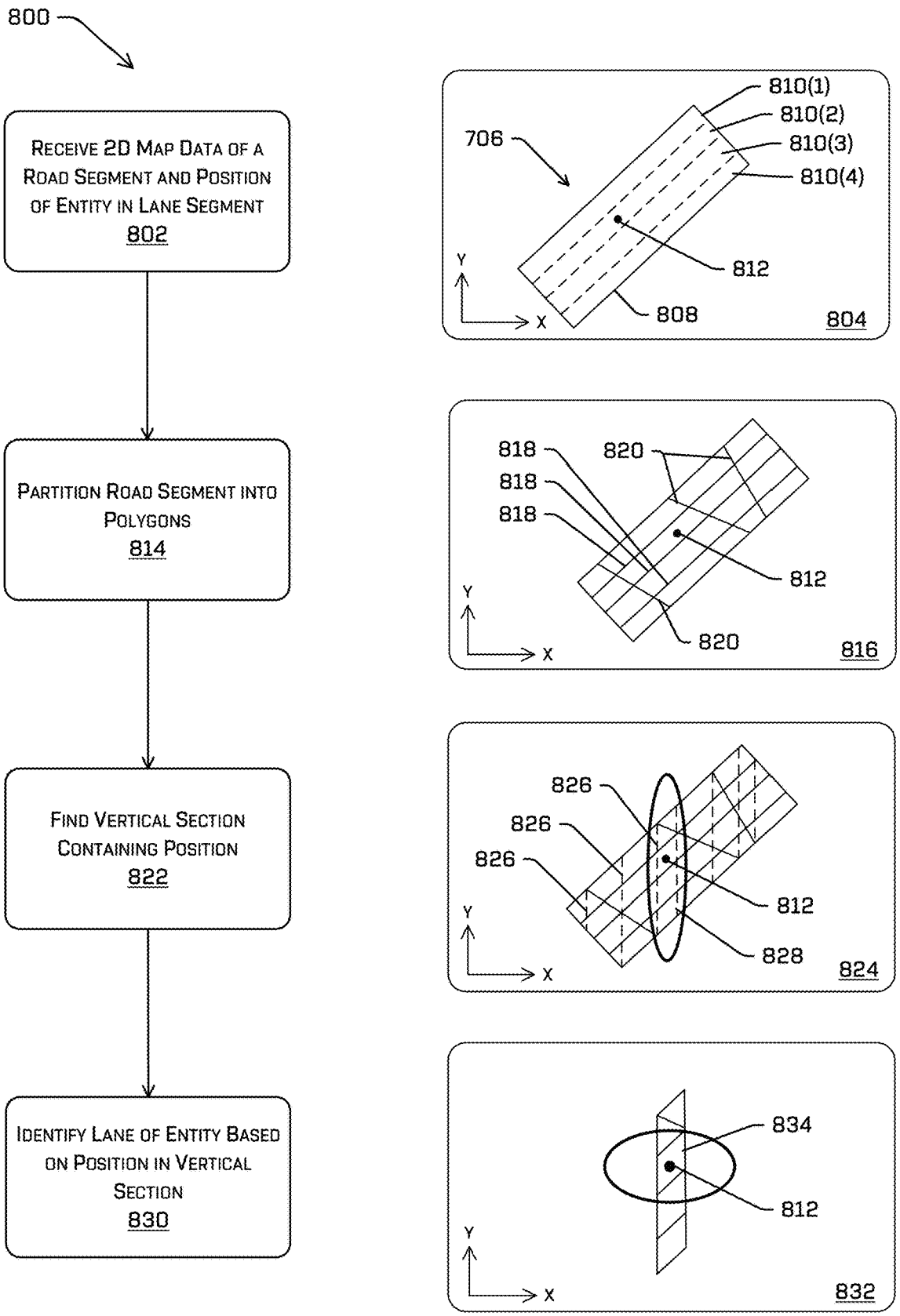
FIG. 8 includes textual and visual flowcharts to illustrate an example method of locating a position of an entity in a road segment, according to aspects of this disclosure.

The entity location component 120 can include functionality to identify entities proximate the autonomous vehicle 102, such as the additional vehicles 112, and determine positions of those entities in a mapped region represented by the map(s) 118. In examples, the entity location component 120 can determine the location of the additional vehicles 112 in the mapped region to identify a road segment and/or a lane of the road segment in which the entity is located. Thus, for example, the entity location component 120 may determine that each of the first additional vehicle 112(1), the third additional vehicle 112(3), and the fourth additional vehicle 112(4) are located in the first lane 110(1), that the fifth, sixth, and seventh additional vehicles 112(5), 112(6), 112(7) are located in the second lane 110(2), and so forth. In some examples, the entity location component 120 can determine the positions of the entities in the mapped region by implementing a positional lookup. In some examples, the positional lookup can include querying a two-dimensional tree structure, e.g., using a KD tree structure, or the like. FIGS. 6-8, described in more detail herein, illustrate additional example techniques for locating a position in a mapped region and converting that position to a vehicle-centric, or track, frame of reference.

The interaction determination component 122 can include functionality to determine associations between vehicles on the road 104. In some examples, the interaction determination component 122 can group vehicles according to lanes in which they are currently traveling and/or lanes in which they may travel in the future. In the example of FIG. 1, the interaction determination component 122, using information provided by the entity location component 120, may determine that the eighth additional vehicle 112(8) and the ninth additional vehicle 112(9) are located in the same lane, e.g., the third lane 110(3). Based on both of these vehicles travelling in the same lane, the interaction determination component 122 may associate the eighth additional vehicle 112(8) and the ninth additional vehicle 112(9), e.g., as connected nodes in a data set. Similarly, the interaction determination component 122 may group or associate the fifth additional vehicle 112(5), the sixth additional vehicle 112(6), and the seventh additional vehicle 112(7) based on each being located in the second lane 110(2).

In some implementations, the interaction determination component 122 may also access traffic control information. For instance, the section of the first lane 110(1) approaching the junction 106 may facilitate either a left turn, e.g., on to the second road segment 106(2), or through traffic, e.g. continuing in the first lane 110(1) into the third road segment 106(3). Accordingly, the interaction determination component 122 may associate the first additional vehicle 112(1) with both the second additional vehicle 112(2), which has already left the first lane 110(1) via a left-hand turn and the third additional vehicle 112(3), which is continuing straight through the intersection. Conceptually, the first additional vehicle 112(1) may follow either the second additional vehicle 112(2) or the third additional vehicle 112(3), because the first lane 110(1) allows for either the left-hand turn or straight travel through the intersection. In some implementations, the interaction determination component 122 can also use contextual information from other sources. Consider the example in which the first additional vehicle 112(1) has signaled a left-hand turn, e.g., via a blinker or turn signal. In this example, the interaction determination component 122 may associate the first additional vehicle 112(1) with the second additional vehicle 112(2), but not the third additional vehicle 112(3), because the first additional vehicle 112(1) has signaled its intention to leave the first lane 110(1) whereas the third additional vehicle 112(3) is continuing in the first lane 110(1). Continuing this example, the interaction determination component 122 may associate the autonomous vehicle 102, which desires to continue on the first lane 110(1), e.g., via the drive path 114, with the third additional vehicle 112(3), which the autonomous vehicle 102 will follow upon the first additional vehicle 112(1) completing its left-hand turn.

The graph generation component 124 can include functionality to generate one or more directed graphs 126 representative of the associations determined by the interaction determination component 122. For example, the graph generation component 124 may associate an identifier with each entity, e.g., each of the additional vehicles 112, and generate a node associated with each of the vehicles. The graph generation component 124 may also generate edges connecting the nodes to complete the directed graphs 126. In examples, each edge may represent an association of a lead vehicle with a following vehicle. Additional details of generating a directed graph of the type just described and updating a directed graph are described further in connection with FIGS. 2-5.

In some examples, the vehicle 102 can be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such an example, since the vehicle 102 can be configured to control all functions from start to stop, including all parking functions, it can be unoccupied. This is merely an example, and the systems and methods described herein can be incorporated into any ground-borne, airborne, or waterborne vehicle, including those ranging from vehicles that need to be manually controlled by a driver at all times, to those that are partially or fully autonomously controlled. Additional details associated with the vehicle 102 are described below.

Also in some examples, the vehicle 102 may include one or more sensor systems (not shown), which can include, but is/are not limited to, light detection and ranging (LIDAR) sensors, radio detection and ranging (RADAR) sensors, time-of-flight sensors, ultrasonic transducers, sound navigation and ranging (SONAR) sensors, location sensors (e.g., global positioning system (GPS), compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), etc. As described herein, sensor data from the sensor systems may be used to locate entities in the environment and/or to determine controls relative to those entities.

FIG. 1 illustrates a single example of navigating an environment using vehicle control techniques. Other examples also are contemplated. For example, although FIG. 1 illustrates the twelve additional vehicles 112, more or fewer entities and/or objects, and/or different entities may be disposed in the environment 100. Moreover, the arrangement of the road segments 106 and/or the junction 108 may vary.

Figure 2:
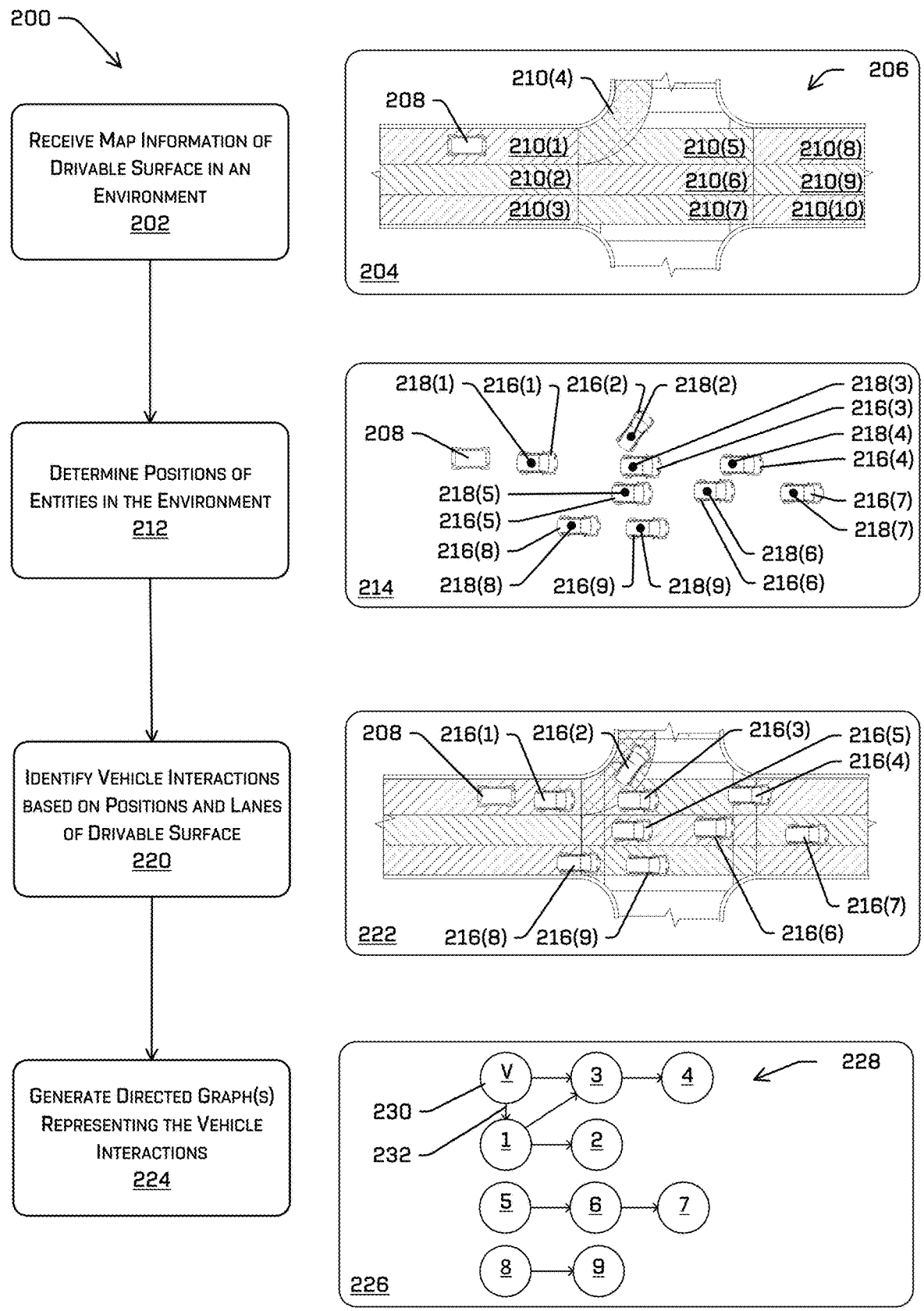
FIG. 2 includes textual and visual flowcharts to illustrate an example method of generating a directed graph representative of vehicle interactions, according to aspects of this disclosure.

FIG. 2 depicts a pictorial flow diagram of an example process 200 for generating one or more directed graphs representative of entities on a navigable surface, e.g., vehicles travelling along a road network, such as the road 104. For example, the process 200 may be implemented by one or more components of the vehicle computing device(s) 116, including but not limited to, the entity location component 120 and/or the graph generation component 124. However, the process 200 is not limited to use with the vehicle computing device(s) 116, the vehicle computing device(s) 116 may perform operations and/or processes in addition to, or instead of, the process 200.

At operation 202, the process 200 can include receiving map information of a drivable surface in an environment. For example, the mapped region may be a map corresponding to a city or location in which an autonomous vehicle operates. An example 204 accompanying the operation 202 includes a graphical representation of a map 206. For example, the map 206 may correspond to the road 104 shown in FIG. 1. An autonomous vehicle 208, which may be the autonomous vehicle 102, shown for reference on the map 206. The map 206 is illustrated as including information about portions of a drivable surface. For example, the map 206 includes ten discrete segments, each corresponding to a portion of a lane or junction. More specifically, the map 206 illustrates a first road segment 210(1), a second road segment 210(2), a third road segment 210(3), and so forth (collectively, the road segments 210). In the example, each of the road segments 210 corresponds to a portion of a lane thus, for example, the third road segment 210(3), the seventh road segment 210(7), and the tenth road segment 210(10) may together comprise a lane of travel in the map 206. This disclosure is not limited to the map segmentation illustrated in the example 204. The drivable surface may be otherwise segmented in other implementations. By way of nonlimiting example, the third road segment 210(3), the seventh road segment 210(7), and the tenth road segment 210(10) may be formed as a single road segment in some implementations.

At operation 212, the process 200 can include determining positions of entities in the environment. For example, and as described further herein, an autonomous vehicle may include one or more sensors, and sensor data generated by those sensors may be used to determine positions of entities in the environment. In such examples, the positions may be relative to the vehicle. An example 214 accompanying the operation 212 provides a schematic illustration of the vehicle 208 and vehicles in an environment of the vehicle 208. More specifically, nine vehicles are represented in the example 214, including a first vehicle 216(1) at a first position 218(1), a second vehicle 216(2) at a second position 218(2), a third vehicle 216(3) at a third position 218(3), and so forth. In the example 214, the vehicles 216(1)-216(9) may correspond to the additional vehicles 112(1)-112(9) from FIG. 1. In the example, each of the positions 218 may be associated with a single point in a reference frame of the map 206. For example, the point may approximate a center of the corresponding one of the vehicles 216. In other examples, however, the point may be a point on a bounding box defining the vehicle 216. For instance, the point may be a point closest to the vehicle 208 on the bounding box. In other examples, each of the entities may be described by more than one point. For instance, each of the positions 218 may include information about the four corners of a bounding box describing the additional vehicle. As noted above, the positions of the entities may be in a global or inertial coordinate system, which may be a UTM (Universal Transverse Mercator) coordinate system.

At operation 220, the process 200 can include identifying vehicle interactions, based on the positions and lanes of the drivable surface. For example, once the positions 218 of the entities 216 are known, those positions 218 can be compared to the map data to determine a lane in which the vehicle is located. In some examples, the entity location components 120 can query a lookup table or other data structure that associates positions in a global coordinate system with portions of the road. Details of other examples of locating entities is described further below in connection with FIGS. 6-8. In an example 222 accompanying the operation 220, the representations of the vehicles 216 at the determined positions 218 are visualized on the map 206. As illustrated, the autonomous vehicle 208 and the first additional vehicle 216(1) are in the first road segment 210(1), the second additional vehicle 216(2) is in the fourth road segment 210(4), the fifth third additional vehicle 216(3) is in the fifth road segment 210(5) and so forth. Thus, assuming that the third road segment 210(3), the seventh road segment 210(7), and the tenth road segment 210(10) constitute a single lane of traffic, e.g., the third lane 110(3) of FIG. 1, the vehicles in those lanes, e.g., the eighth vehicle 216(8) and the ninth vehicle 216(9) are associated with the operation 220. Similarly, the fifth additional vehicle 216(5), the sixth additional vehicle 216(6), and the seventh additional vehicle 216(7) are all in the lane including road segments 210(2), 210(6), 210(9) and thus can also be associated at the operation 220.

In the example 204, vehicles exiting the first road segment 210(1) can follow either the fourth road segment 210(4), e.g. by making a left turn, or the fifth road segment 210(5), e.g. by proceeding straight through the intersection. Accordingly, vehicles approaching this branch or split may be associated with the immediately preceding vehicle in both. Thus, for example, the first additional vehicle 216(1) can be associated with both the second additional vehicle 216(2) and the third additional vehicle 216(3) (which is also associated with the fourth additional vehicle 216(4), by virtue of both the third additional vehicle 216(3) and the fourth additional vehicle 216(4) being in the lane including the fifth road segment 210(5) and the eighth road segment 210(8)). Also in the example, the vehicle 208 may be associated with both the first additional vehicle 216(1), e.g., because the vehicle 208 is directly behind the first additional vehicle 216(1), and also with the third additional vehicle 216(3), e.g., because the third additional vehicle 216(3) will be the vehicle immediately preceding the vehicle 208 should the first additional vehicle 216(1) exit the vehicle 208 travel path. Of course, if the vehicle 208 was intending to turn left onto the road segment 210(4), the vehicle 208 may be associated with the second additional vehicle 216(2), e.g., instead of with the third additional vehicle 216(3).

At operation 224, the process 200 can include generating one or more directed graphs representative of the vehicle interactions. An example 226 accompanying the operation 224 provides an example of a directed graph 228 representative of the scenario illustrated in the example 222. In the directed graph 228, each of the entities, e.g., the vehicle 208 and the additional vehicles 216, is represented as a node 230. In the example 226, the node 230 labeled with the letter "V" represents the vehicle 208 and each of the numbered nodes represents one of the additional vehicles 216. Specifically, the node 230 with the number "1" represents the first additional vehicle 216(1), the node 230 with the number "2" represents the second additional vehicle 216(2), and so forth. Also in the directed graph 228, interactions or associations between the nodes are represented as edges 232. Thus, for example, the edges 232 indicate that the vehicle 208 is associated with (e.g., is following) one or both of the first additional vehicle 216(1) and/or the third additional vehicle 216(3). The first additional vehicle 216(1) may follow or be associated with either the second additional vehicle 216(2) (e.g., because the first additional vehicle 216(1) may make a left-hand turn, following the second additional vehicle 216(2)) or the third additional vehicle 216(3) (e.g., because the first additional vehicle 216(1) may proceed straight through the intersection, following the third additional vehicle 216(3)). Accordingly, the directed graph 228 provides a straightforward and ordered representation of a relatively congested intersection.

As described further herein, the directed graph 228 may be used by a vehicle computing device, such as the vehicle computing device(s) 116, to more efficiently plan routes and/or control a vehicle, such as the vehicle 208, in the environment. In some instances, e.g., as described below with reference to FIG. 5, the directed graph 228 may be used to determine entities in the environment of the vehicle for consideration in such planning and/or controlling.

Figure 3:
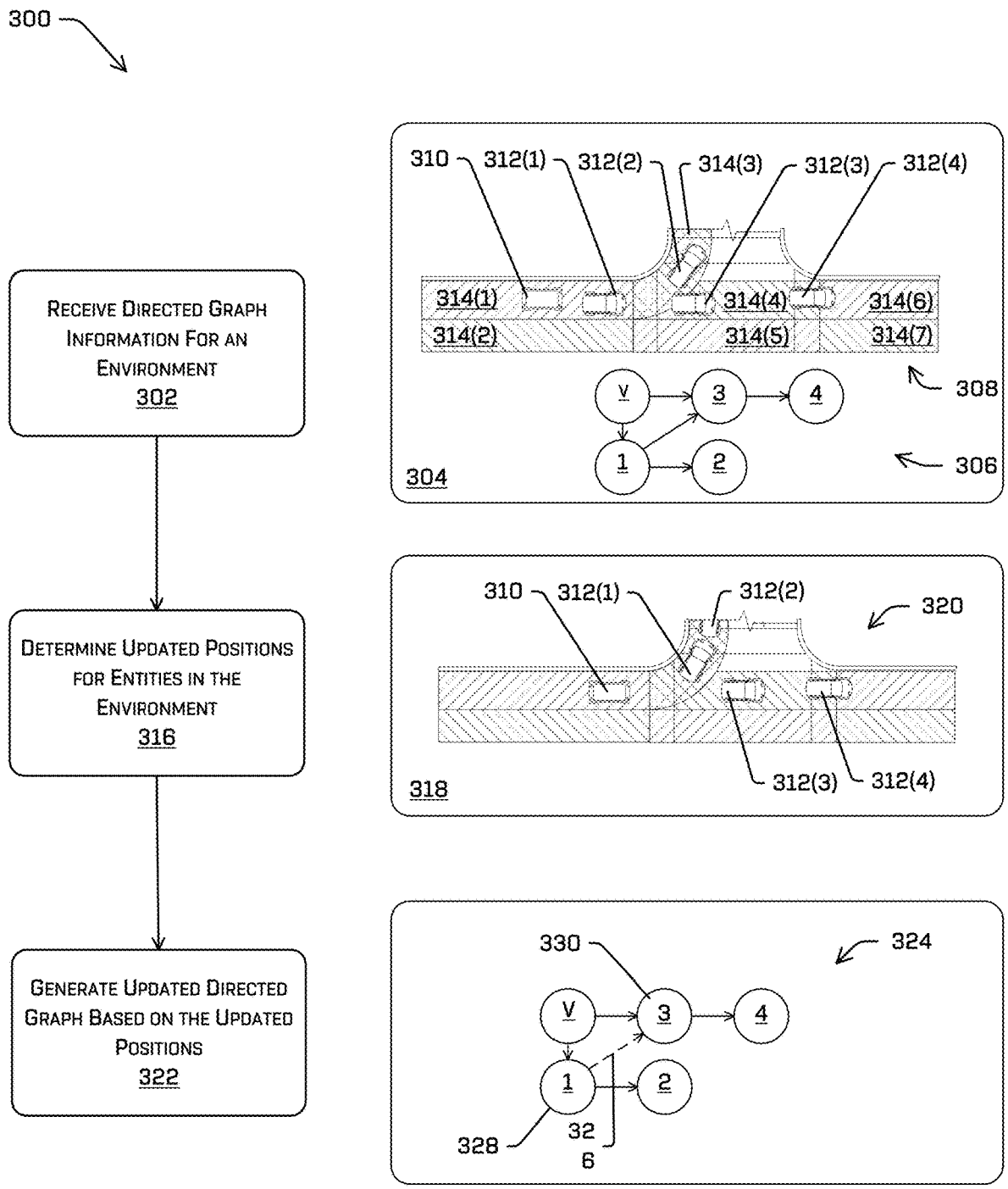
FIG. 3 includes textual and visual flowcharts to illustrate an example method of updating a directed graph representative of vehicle interactions based on vehicle movement, according to aspects of this disclosure.

FIG. 3 depicts a pictorial flow diagram of an example process 300 for updating a directed graph in response to changed entity positions. For example, the process 300 may be implemented by one or more components of the vehicle computing device(s) 116, including but not limited to the entity location component 120, the interaction determination component 122 and/or the graph generation component 124. However, the process 300 is not limited to use with the vehicle computing device(s) 116 (or components thereof), and the vehicle computing device(s) 116 may perform operations and/or processes in addition to or different from the process 300.

At operation 302, the process 300 includes receiving directed graph information for an environment. An example 304 accompanying the operation 302 includes an example directed graph 306 and a representation 308 of a scenario represented by the directed graph 306. In more detail, the representation 308 includes a representation of an autonomous vehicle 310, a first additional vehicle 312(1), a second additional vehicle 312(2), a third additional vehicle 312(3), and a fourth additional vehicle 312(4) (collectively, the additional vehicles 312). In some examples, the autonomous vehicle 310 may correspond to the vehicle 208 and/or the additional vehicles 312 may correspond to the additional vehicles 216(1)-216(4), from FIG. 2. The representation 308 also indicates road segments 314(1)-314(7).

At operation 316, the process 300 can include determining updated positions for entities in the environment. An example 318 accompanying the operation 316 shows an updated representation 320 of the environment in which the vehicle 310 and some of the additional vehicles 312 have moved. The representation 320 may be associated with a future time or a simulated future time. In the representation 328, the first additional vehicle 312(1) is now located at a new position in the third road segment 314(3). The first additional vehicle 312(1) has commenced a left-hand turn.

At operation 322, the process 300 can include generating an updated directed graph based on the updated positions. For example, the movement (real or simulated) of entities within the road segments can have an impact on associations between those entities. In the example 318, because the first additional vehicle 312(1) is now in the third road segment 314(3), the first additional vehicle 312(1) may be disassociated from the third additional vehicle 312(3). The updated graph 324 shows this disassociation by removing the edge 326 between the node 328 associated with the first additional vehicle 312(1) and a node 330 representing the third additional vehicle 312(3). Thus, in the illustrated updated directed graph 324, the edge 326 is removed from the graph. Notably, the node associated with the vehicle 310 is still connected to both the node 328 and the know 330. In this example, although the vehicle 310 may intend to follow the third additional vehicle 312(3), and not the first additional vehicle 312(1), the first additional vehicle 312(1), may still be located, at least partially, in the travel path of the vehicle 310. Accordingly, and as described herein, the directed graph 324 may be used to control the autonomous vehicle 310, and thus it may continue to be important to be connected to any additional vehicle that may impede travel of the vehicle 310. In this example, once the first additional vehicle 312(1) leaves the travel path, e.g., completely exits the fourth road segment 314(4), the updated directed graph 324 may be further updated to remove the edge extending between the vehicle node and the node 328.

Figure 4:
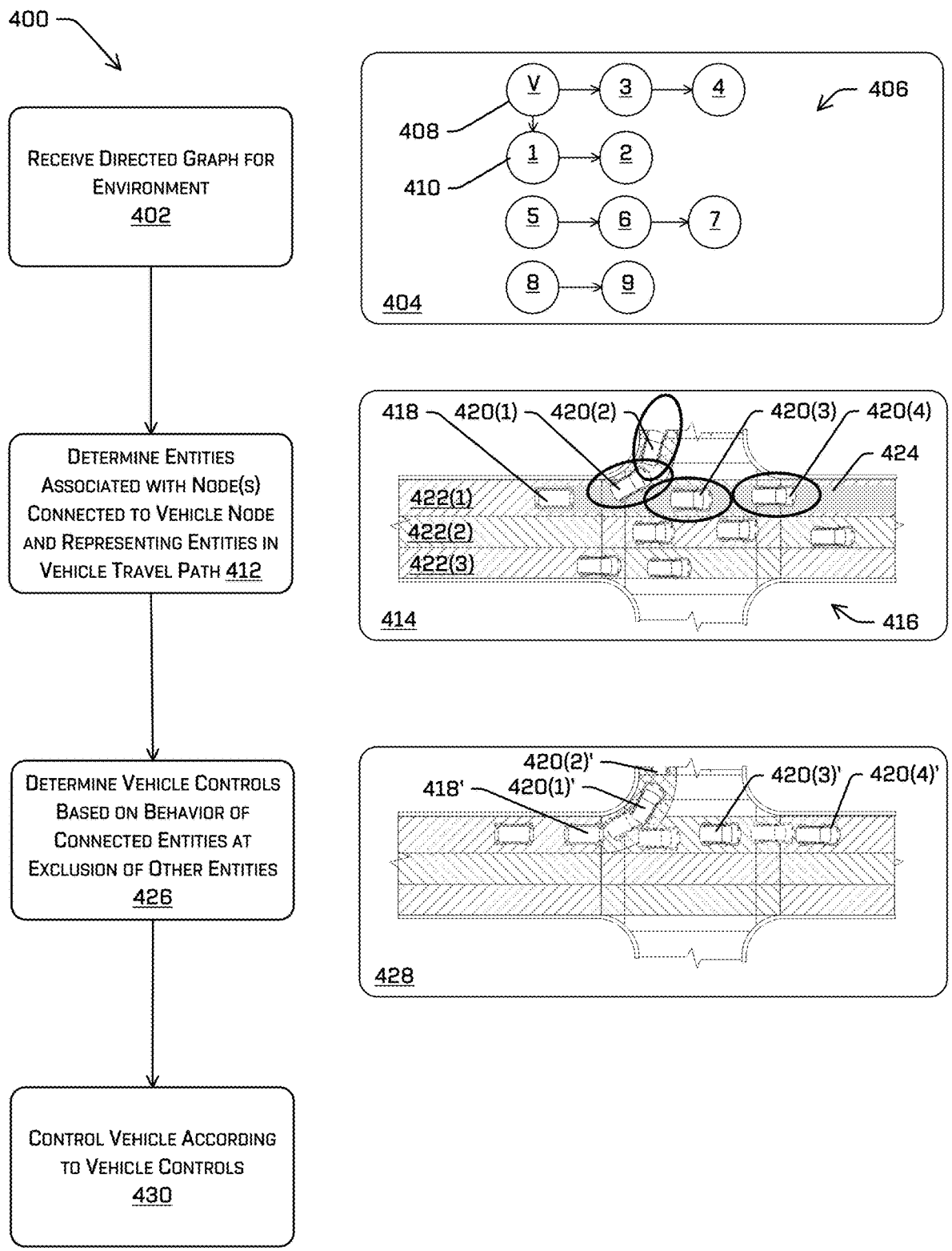
FIG. 4 includes textual and visual flowcharts to illustrate an example method of using a directed graph representative of vehicle interactions to generate vehicle controls, according to aspects of this disclosure.

FIG. 4 shows aspects of this and other techniques in more detail. More specifically, FIG. 4 depicts a pictorial flow diagram of an example process 400 demonstrating a use case for a directed graph. In the specific use case, the directed graph may be used to identify entities that may impact travel of an autonomous vehicle and generate and implement vehicle controls relative to those entities, e.g., at the exclusion of other entities. For example, the process 400 may be implemented by one or more components of the vehicle computing device(s) 116. However, the process 400 is not limited to use with the vehicle computing device(s) 116, and the vehicle computing device(s) 116 may perform operations and/or processes in addition to or alternative of the process 400.

At operation 402, the process 400 can include receiving a directed graph of an environment. In an example 404 accompanying the operation 402, a directed graph 406 includes a first node 408 identified by the letter "V" and a plurality of additional, numbered nodes 410. In this example, the directed graph 406 corresponds to the directed graph 228, updated in accordance with the process 300. More specifically, the directed graph 406 is identical to the directed graph 228, except the edge between the node "2" and the node "3" has been removed.

At operation 412, the process 400 can determine entities associated with nodes connected to the vehicle node and representing entities in a vehicle travel path. An example 414 accompanying the operation 412 provides a representation 416 of the environment embodied by the directed graph 406. More specifically, the representation 416 generally includes an autonomous vehicle 418 and first through ninth additional vehicles 420(1)-420(9) (collectively, the additional vehicles 420). For clarity, not all of the additional vehicles 420 are individually labeled, although they may generally correspond to the additional vehicles 216 from FIG. 2. In this example, as in previous examples, the autonomous vehicle 418 intends to travel along a travel path 424 straight through the intersection, e.g., by staying in a first lane 422(1). A second lane 422(2) and a third lane 422(3) also are shown in the representation 416. Accordingly, the operation 412 may determine that any vehicle in the first lane 422(1) may be in the autonomous vehicle's 418 travel path. In this example, the first additional vehicle 420(1), the third additional vehicle 420(3), and the fourth additional vehicle 420(4) are at least partially in the first lane 422(1), and thus are highlighted at the operation 412. The second additional vehicle 420(2) also is highlighted, because it is connected to the first additional vehicle in the directed graph 406. For example, the operation 412 may query the directed graph 406 to determine connected nodes 1, 2, 3, 4. In contrast, because nodes associated with other of the additional vehicles 420 are not connected in the directed graph, the process 400 may exclude those entities from further consideration.

At operation 426, the process 400 may plan vehicle controls based on behaviors of the connected entities, at the exclusion of other entities. An example 428 accompanying the operation 426 illustrates a simulation of the vehicle 418, the first additional vehicle 420(1), the second additional vehicle 420(2), the third additional vehicle 420(3), and the fourth additional vehicle 420(4). Specifically, the example 428 shows a simulated vehicle 418' and simulated additional vehicles 420(1)', 420(2)', 420(3)', 420(4)', e.g., at simulated locations at a future point in time. Because other entities are not considered in determining controls for the vehicle 418, computational resources may be freed up. In some examples, such computational resources may allow for additional analysis of the entities affecting travel of the vehicle 418. For example, and as discussed above, behavior of each vehicle-of-interest may be tied or otherwise related to behavior of an immediately preceding vehicle, as indicated by the directed graph 406. In one example, instead of assuming that each of the additional vehicles 420(1), 420(3), 420(4), will behave in an identical, predetermined way, a predicted behavior, e.g., path, velocity, acceleration, or the like, of the third additional vehicle 420(3) may be predicated on a behavior of the fourth additional vehicle 420(4). Similarly, a predicted behavior of the first additional vehicle 420(1) may be predicated or otherwise related to a behavior of the second additional vehicle 420(2).

In a specific implementation of the operation 426, behaviors of the first additional vehicle 420(1), the third additional vehicle 420(3), and the fourth additional vehicle 420(4), may be used to determine whether the vehicle 418 can safely, and lawfully, pass (completely) through the intersection. In at least one example, a predicted position of the third additional vehicle 420(3) at one or more future points in time may be determined, e.g., based on the third additional vehicle's 420(3) reactions to the fourth additional vehicle 420(4). Thus, for example, if a prediction indicates that the third additional vehicle 420(3) will not clear the intersection sufficiently for the autonomous vehicle 418 to also clear the intersection e.g., in some predetermined amount of time, the vehicle 418 may be controlled to wait before the intersection. In contrast, in conventional models, the autonomous vehicle 418 may have entered the junction causing gridlock, because it was unable to also exit the intersection, owing to the simplistic, disconnected prediction models. In at least other examples, various other behaviors of the one or more additional vehicles 420 may be modeled based at least in part on the various edges of the interaction graph. As non-limiting examples, velocities, accelerations, relative positions, and the like may be bounded based at least in part on a leading vehicle.

In the example 428 a single simulation is shown. In practice, however, a simulation may include a number of incremental (in time) simulations to predict entity behaviors and controls relative to those behaviors. In some examples, up to about 20 incremental prediction simulations may be performed during a control cycle, e.g., simulating from increments of from about 0.5 seconds to about 1.5 seconds. Accordingly, in the example 426, the first additional vehicle 420(1) may be predicted to clear the travel path 424 within the simulated window. In implementations, once the first additional vehicle 420(1) clears the drive path, the directed graph 406 may be updated to disassociate the first node 408 from the node 410, thereby further reducing computational requirements associated with the first additional vehicle 420(1) and any associated (e.g., in the directed graph) vehicles. Also in examples, the directed graph may be updated across simulation to include new nodes (e.g., connected nodes). For instance, an unconnected vehicle may be identified as likely to impede on the travel path 424 of the vehicle 418 at some point in the future, and a node associated with the unconnected vehicle may be added to the directed graph to simulate such an interfering behavior.

At operation 430, the process 400 may also include controlling the vehicle according to the vehicle controls. As described further herein, the autonomous vehicle 418 may include one or more drive modules and/or other components configured to receive vehicle controls and operate the vehicle in accordance with those controls. In the example just described, the operation 430 may control the vehicle to wait to enter the intersection when the third additional vehicle 420(3) may not exit the intersection sufficiently and/or in time for the autonomous vehicle 418 to also exit the intersection.

Figure 5:
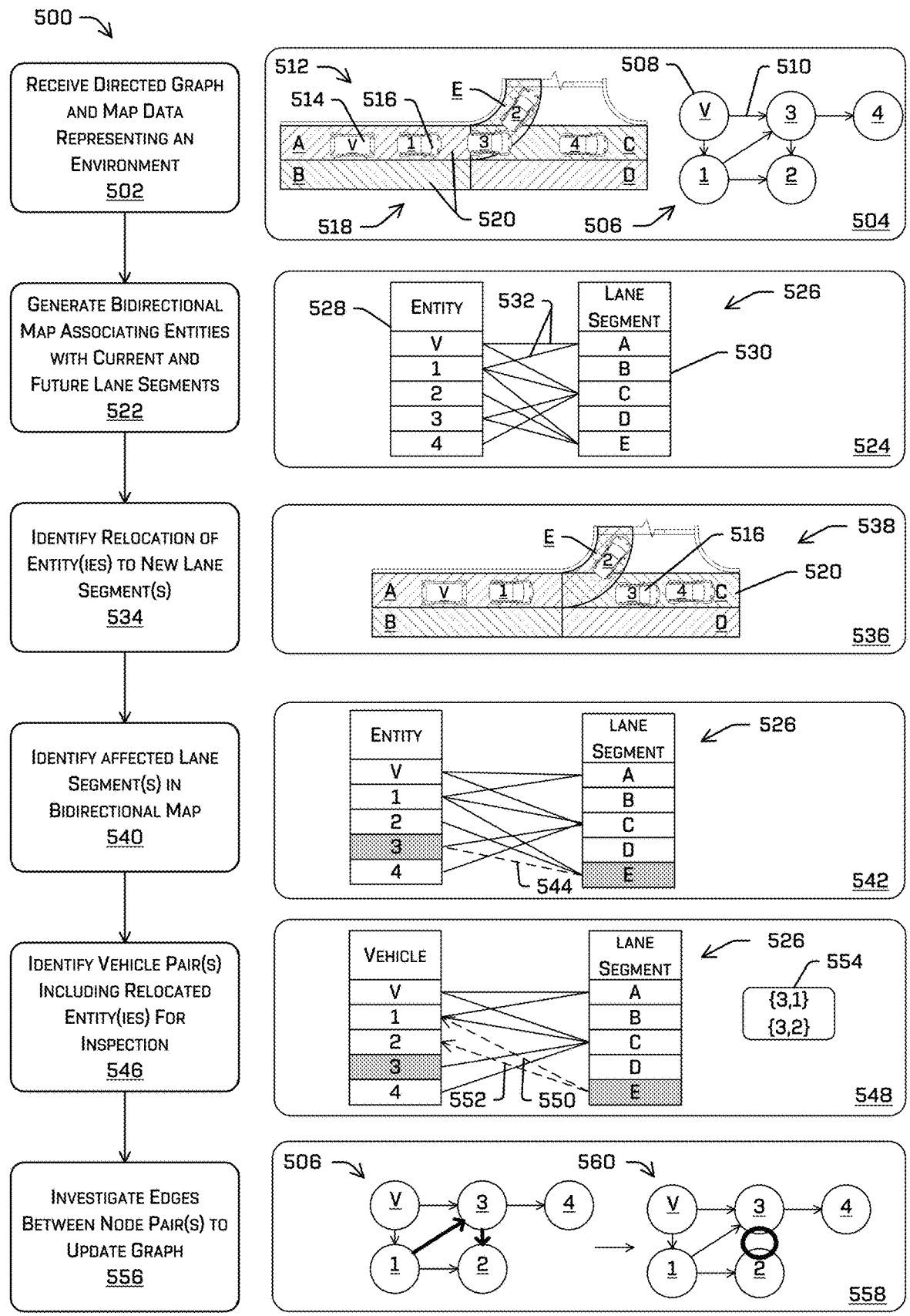
FIG. 5 includes textual and visual flowcharts to illustrate another example method of updating a directed graph representative of vehicle interactions using a bidirectional map, according to aspects of this disclosure.

FIG. 5 depicts a pictorial flow diagram of an example process 500 for updating a directed graph. For example, the process 500 may be implemented by one or more components of the vehicle computing device(s) 116, such as the graph generation component 124. However, the process 500 is not limited to use with the vehicle computing device(s) 116, and the vehicle computing device(s) 116 may perform operations and/or processes in addition to or instead of the process 500. In some examples, the process 500 may be used in connection with the process 300 described above. In at least some examples, the process 300 may implement the techniques of the process 500, to determine the updated directional graph 324.

At operation 502, the process 500 can receive a directed graph and map data representing an environment. In the example 504 accompanying the operation 502, a directed graph 506 includes five nodes 508 connected by edges 510. For simplicity, only one node 508 and one edge 510 are labeled in the example 504. The example 504 also includes a representation 512 of the environment, generally showing an autonomous vehicle 514 and four additional vehicles 516 on a mapped region 518. In the representation 512, the additional vehicles 516 are labelled with integers, which integers also are used to label the nodes 508. Thus, the node 508 labeled with the number "1" corresponds to the additional vehicle 516 labelled with the number "1," and so forth. Similarly, the node 508 labelled with the "V" represents the autonomous vehicle 514. The mapped region 518 generally represents the drivable surface, and includes lane segments 520, labelled A-E. The lane segments 520 may correspond to portions of driving lanes in the mapped region, e.g., as determined from the received map data. Thus, for example, the lane segments 520 labelled with "A" and "C" may be longitudinal segments of a same, first lane and the lane segments 520 labelled with "B" and "D" may be longitudinal segments of a same, second lane.

At operation 522, the process 500 may include generating a bidirectional map associating entities with current and future lane segments. An example 524 accompanying the operation 522 provides a visualization of a bidirectional map 526 corresponding to the scenario shown in the representation 512. Generally, and as used herein, the bidirectional map can be a data structure that associates pairs of values (a,b) in a one-to-one, one-to-many, or a many-to-many correspondence, which may have corresponding directionality (e.g., querying the map based on "a" may yield "b", while querying the map for "b" may not yield "a"). In one example described herein, a first set of values may map to a second set of values. In such an example, when querying the bidirectional map based on a value the first set, a second value of the second set may be retrieved, but when querying the map based on the second set of values, at least a third value of the first set of values may be retrieved. In implementations, the bidirectional map includes relationships between entities and one or more lane segments, as described herein. More specifically, the bidirectional map 526 includes a first column 528 comprising a list of each of the entities represented in the directed graph 506 and a second column 530 comprising a list of each of the lane segments 520. The bidirectional map 526 also includes a plurality of edges 532 indicative of relationships between each entity and one or more of the lane segments. While the example 524 visualizes the bidirectional map 526 as two columns, such visualization is for example only. As illustrated, each of the edges 532 connects an entity to a lane segment in which the entity is currently located and any lane segment(s) that the respective entity could enter. Thus, each of the edges 532 represents a pair of values, e.g., one entity and one of the lane segments. For example, the vehicle 514 "V" is connected to the lane segment A, because the vehicle 514 is currently in the lane segment A. Moreover, the vehicle 514 is known to be travelling along a path that will have the vehicle 514 stay in the lane, and thus, the vehicle 514 may (will) enter the lane segment B in the future. Also in the example 524, the additional vehicle represented by the "1" is similarly in the lane segment A, so an edge connects the "1" to the "A" in the bidirectional map. That vehicle may also enter either the lane segment C or the lane segment E (assuming no lane changes), so edges also connect entity "1" to the lane segments C and E. Similarly, edges 532 are used to connect the entity "2" to the lane segment E, entity "3" to lane segments C and E (e.g., because the additional vehicle 516 represented by the number 3 is in both of those segments), and entity "4" to lane segment C.

At operation 534, the process 500 can include identifying a relocation of one or more entities to one or more new lane segments. In the example 536 accompanying the operation 534, an updated representation 538 illustrates that the additional vehicle 516 indicated by the number 3 has now entered completely into the lane segment 520 indicated by the letter C. That vehicle is no longer also in the lane segment indicated by the letter E. In this example, no other of the additional entities have changed lane segments.

At operation 540, the process 500 can identify affected lane segments from the bidirectional map. In an example 542 accompanying the operation 540, the bidirectional map 526 is provided. In the bidirectional map 526, an affected edge 544 is illustrated as a dashed line. Specifically, by virtue of the vehicle associated with the entity 3 passing the lane segment E, the affected edge 544 should be removed from the bidirectional map 526. The affected edge 544 may also provide information about other entities that may be affected by the entity 3's move to a new location.

At operation 546, the process 500 may include identifying vehicle pairs including the relocated entities for inspection. In the example 548 accompanying the operation 546, the affected edge 544 has been removed from the bidirectional map 526 and the edges 532 connecting the lane segment E with the entity 2 and with the entity 3 have been replaced with directional arrows 550, 552, respectively. The directional arrows 550, 552 identify two entities that were potentially affected by the movement of the vehicle associated with the entity 3. Stated differently, because entity 3 is no longer connected to lane segment E, the universe of potential connections in the directed graph 506 is limited to other entities that have a relationship with the lane segment E. Because the bidirectional map stores such relationships, all pairs in the bidirectional map that include the lane segment E can be identified as potentially affected entities, e.g., pairs (1,E) and (2,E). In the illustrated example, then, the potentially affected entities are entity 1 and entity 2. The example 548 also includes a set of node pairs 554 which are representative of each of the node connections that may be affected. In this example, the node pairs 554 include {3,1} and {3,2}.

At operation 556, the process 500 can investigate edges between the determined node pairs to update the graph. In an example 558 accompanying the operation 556, the two edges 510 between the node pairs 554, e.g., the node pairs {3,1} and {3,2}, are offset in darker font, as edges for inspection. In this example, upon inspection, the entity 1 may still follow the entity 3 and thus the edge associated with the pair {3,1} is still correct. However, because the entity 3 can no longer follow the entity 2, the edge 510 associated with the pair {3,2} has been removed in an updated directed graph 560. In some examples, the operation 556 may include propagating back from the node 3 to each of the nodes 1 and 2 to determine whether they are travelling in a same direction and/or along a same lane segment 520.

The process 500 may be a process to incrementally update directed graphs such as those described herein. This technique for incrementally upgrading the directed graphs may significantly reduce a time necessary to build graphs. For instance, the process 500 may be used in connection with the process 400. For instance, as discussed above, the process 400 may identify only those portions of the directed graph that need be considered in generating controls for the autonomous vehicle. Moreover, in instances in which a series of simulations are run to determine a future position of each of the entities, incrementally updating the graphs according to the process 500 may provide faster results. By way of nonlimiting example, consider a series of incremental simulations in the environment shown in the example 426 of FIG. 4. As the first additional vehicle 420(1) exits the lane 422(1), the directed graph 406 may be updated using the process 500 to generate additional of the incremental simulations at the exclusion of the first additional vehicle 420(1) (and any vehicles it may follow).

A process similar to the process 500 may also be used to introduce newly observed entities. For instance, as a new entity is identified, e.g. from sensor data, that entity can be located in the environment (e.g., using the techniques described herein). Moreover, the new entity can be added to the "entity" column and paired with a current lane of the entity, e.g., based on the location. The new entity may also be associated with lanes in which the entity may travel.

As described, the process 500 may be used to increase performance of vehicle control using directed graphs. Specifically, the process 500 can reduce computational time and/or computational load associated with generating and updating such graphs, which may be useful to identify relevant entities that may impact travel of the vehicle. Controls generated based on the directed graphs may be more accurate, improving driving outcomes.

FIGS. 6-8 illustrate processes 600, 700, 800 respectively, that, among other things, can also be used to increase performance of vehicle control systems using directed graphs. More specifically, FIGS. 6-8 depict flow diagrams of the processes 600, 700, 800 for locating entity positions in a mapped region. For example, the processes 600, 700, 800 may be implemented by one or more components of the vehicle computing device(s) 116, including but not limited to the entity location component 120 and/or the interaction determination component 122. However, the processes 600, 700, 800 are not limited to use with the vehicle computing device(s) 116, and the vehicle computing device(s) 116 may perform operations and/or processes in addition to, or instead of, the processes 600, 700, 800. In some examples, the processes 600, 700 may implemented as a portion of other processes described herein. For instance, the processes 700, 800 may be implemented as a portion of the operation 220, e.g. to determine the position of an entity in a road segment. However, the processes 600, 700, 800 are not limited to inclusion in other processes described herein, and are not limited to uses including directed graphs and/or vehicle control. For example, in some implementations, the processes 600, 700, 800 may be used to determine the location of an object in a mapped region, regardless of a subsequent use of that location information.

In more detail, the process 600 generally relates to a method for generating a data structured used to determine a road segment in which an entity is located using position information and map data. At operation 602, the process 600 can include receiving two-dimensional map data of an area. An example accompanying the operation 602 illustrates a map 604 including a number of segments. For example, in the illustration, four connecting road segments 606(1), 606(2), 606(3), 606(4) (collectively, the connecting roads 606) and two junctions 608(1), 608(2) (collectively, the junctions 608) are enumerated. (Additional road segments also are illustrated, but not labeled.) In this example, each of the junctions 608 is a confluence of two or more of the connecting roads 606 and each of the connecting roads 606 extends between two of the junctions 608. As also illustrated in the example accompanying the operation 602, the map 604 may have a coordinate system, e.g., an x-y coordinate system, which may correspond to the UTM coordinate system or some other coordinate system. Of course, the map 604 is for example only; other examples of road segments, junctions or the like may also be contained in the map, depending on the physical driving surface. As will also be appreciated, the map 604 may provide only a small section of a (much) larger area. Thus, in some implementations, there may be hundreds and potentially thousands or more junctions 608 and a similar number of connecting roads 606. Moreover, each junction 608 may have its own characteristics and/or each connecting road 606 may have its own characteristics, including traffic control information including, but not limited to, information about a direction of travel, rules for entering and exiting the segment/junctions, speed limits, or the like.

At operation 610, the process 600 can include generating axis-aligned bounding boxes (AABBs) for each road segment. As used herein, an AABB is a rectangular shape that bounds an object (e.g., one of the road segments 606 or one of the junctions 608) and has axes aligned in the same directions as other AABBs. An example accompanying the operation 610 illustrates a first AABB 612(1) bounding the first road segment 606(1), a second AABB 612(2) bounding the second road segment 606(2), and a third AABB 612(3) bounding the second junction 608(2). For clarity, only the three AABBs 612(1), 612(2), 612(3) are illustrated. As will be appreciated, however, the operation 610 will also include generating additional AABBs for the third and fourth road segments 606(3), 606(4), the first junction 608(1) and any or all additional segments. As also illustrated in the example accompanying the operation 610, the axes of each of the AABBs 612(1) 612(2), 612(3) are aligned with the axes of the other AABBs, as well as with the coordinate system of the map 604.

At the operation 614, the process 600 includes generating an AABB tree representative of the mapped area. An example accompanying the operation 614 illustrates an AABB tree for the three AABBs 612(1), 612(2), 612(3). The AABB tree is a data structure that may include a root, branches, and leaves. In implementations, the AABB tree may be characterized by each branch having exactly two children and being assigned an AABB that contains all descendants. Moreover, each leaf fits entirely within its parent's AABB. In the illustrated example, the first AABB 612(1) and the second AABB 612(2) do not intersect. Accordingly, in the AABB tree, the two can be children of a first branch 618. In the map accompanying the operation 614, the first branch 618 is illustrated as a first branch AABB 620, which is an AABB that bounds both the first AABB 612(1) and the second AABB 612(2). The third AABB 612(3) is not contained in the first branch AABB 620 and does not intersect either the first AABB 612(1) or the second AABB 612(2). In the example AABB tree, the third AABB 612(3) and the first branch 618 can be children of a second branch 622. In the map accompanying the operation 614, the second branch 622 is illustrated as a second branch AABB 624, which is an AABB that bounds both the first branch AABB 620 and the third AABB 612(3). As noted above, the AABB tree can further include bounding boxes for all junctions and road segments in a geographic area. Accordingly, the AABB tree can vary depending on the number of road segments and junctions. In some examples, thousands of roads can be represented by an AABB tree having fewer than 30 levels of depth.

FIG. 7 depicts a process 700 of using an AABB tree, such as the AABB tree 616 to locate an entity in an environment. At the operation 702, the process 700 can include determining a position of an entity in a global coordinate system. For example, an autonomous vehicle may include a sensor disposed to capture sensor data about an environment of the vehicle. Such sensor data may include information about entities in the environment, including information about a distance and/or position of such entities from the vehicle/sensor. A computing system of the vehicle may also be configured to localize the sensor (and/or the vehicle) in a global coordinate system, e.g., using GPS, maps, and/or the like and determine positions of those entities in the coordinate system based on the relative positions of the entities to the localized vehicle.

At operation 704, the process 700 can include receiving information about an AABB tree. For example, an autonomous vehicle can store the AABB tree 616 in local (e.g., on-board) memory. In other implementations, the AABB tree may be stored remotely and be accessed by the autonomous vehicle. In still further implementations, the AABB tree may be stored remotely and position information about one or more entities may be sent from the vehicle to a remote computing system including the AABB tree, for the remote computing system to search the AABB tree.

At operation 706, the process 700 can search the AABB tree to determine a bounding box corresponding to the position of the entity. In implementations described herein, an entity can include an additional vehicle or other object on a drivable surface in an environment of an autonomous vehicle. For example, the entity can be determined from sensor data acquired by one or more sensors mounted on the autonomous vehicle. Based on the sensor data, the vehicle, e.g., using the vehicle computing device(s) 116, can determine a position of the entity in the global coordinate system. This position may be used to query the AABB tree to determine the bounding box in which the position is located. Some examples can iterate over the AABB tree non-recursively to determine a leaf node that contains the location. In some instances, a point-in-polygon test may be used to determine the AABB in which the position is located. As used herein, the entity position in the global coordinate system can be one or more points associated with the entity.

In other examples, the process 700 can include generating a bounding box for the entity, e.g., an AABB, and determining a node in the AABB tree that includes coordinates of the entity bounding box.

At operation 708, the process 700 can include determining a road segment associated with the position of the entity. For example, and as discussed above in connection with FIG. 6, each AABB may correspond to, e.g., define the extents of, a road segment in a mapped region. Accordingly, determining a bounding box in which a position in the global coordinate system is located will identify a road segment in which the entity corresponding to the position is location. As noted above, some examples may search the AABB tree for one or more locations associated with a bounding box defining an entity. For example, using a bounding box for the entity may facilitate the operation 708 determining multiple road segments, e.g., when the entity is straddling both segments. Discerning between such two segments may be done by performing a point-in-polygon test for determining in which road segment the point lies.

Maintaining an AABB tree for a road network in which an autonomous vehicle operates may be a relatively computationally inexpensive way to determine a segment in which a detected entity is located. In the foregoing examples, the AABBs are used to define road segments including junctions and connecting roads. In other implementations, the AABBs may bound other, or additional, segments. For example, some implementations, including implementations described herein, may use information about a traffic lane, or a portion of a traffic lane, in which an entity is located. In some instances, this higher precision of location may be achieved by generating smaller AABBs, e.g., AABBs for each lane or portion of a lane. However, such smaller AABBs will further enlarge the AABB tree. Moreover, because lanes in a road segment are adjacent each other and generally co-extensive, large portions of the ABBBs may overlap, making it difficult, and in some instances, nearly impossible, to discern locations within two overlapping boxes.

FIG. 8 depicts a pictorial flow diagram of an example process 800 for locating a position of an entity on a road segment. In some examples, the process 700 just discussed may be used to locate an entity in a road segment, whereas the process 800 may determine a position in the road segment, e.g., a lane or segment of a lane. Accordingly, the processes 700, 800 may be used successively to determine entity locations, but the processes 700, 800, are not limited to being used together. Moreover, determining locations in a mapped region may have uses beyond determining locations on a drivable region. For instance, locating objects in a mapped region, e.g., objects other than vehicles or other road-borne entities can be accomplished using techniques described herein.

At operation 802, the process 800 includes receiving two-dimensional map data of a road segment and position information of an entity in the road segment. An example 804 accompanying the operation 802 includes a map 806 of a road segment 808. In some examples, the road segment 808 may be one of the road segments 606 illustrated in FIG. 6 and described above in connection with that figure. For example, the road segment 808 may have been identified by the process 700 as a leaf node in which an entity position is located. As also illustrated in the map 806, the road segment 808 is oriented in a global coordinate system, which may be the same global coordinate system illustrated in FIG. 6. Moreover, the road segment 808 includes a first lane 810(1), a second lane 810(2), a third lane 810(3), and a fourth lane 810(4). A position of an entity is also illustrated in the example 804, with the reference numeral 812. In the illustrated example, and for ease of illustration, the reference number 812 is associated with a single point in the road segment 808. In other examples, however, the position of the entity may be otherwise described. For instance, and without limitation, the position 812 may be embodied as a bounding box or other, non-point. In examples, the position may be expressed as an (x,y) position e.g., in the global map coordinate system.

At operation 814, the process 800 includes partitioning the road segment into polygons. In an example 816 accompanying the operation 814, lines 818 extend generally along a longitudinal direction of the road segment 808 and lines 818 extend generally laterally across the road segment 808. As a result, the road segment 808 is partitioned into a number of quadrilaterals. The lines 818, 820 are for example only, and other polygonal shapes, including non-quadrilaterals, can be used to partition the road segment 808. In the illustrated example, the lines 818 may be closely aligned to the lane boundaries, e.g., separating the lanes 810. While placing the lines 818 in this manner may facilitate location of the position 812, as described further herein, the lines 818, and/or the lines 820, may be otherwise oriented and arranged.

At operation 822, the process 800 may include finding a vertical section containing the position. In an example 824 accompanying the operation 822, a plurality of vertical lines 826, e.g., lines extending in the Y direction, are layered over the road segment including the lines 818, 820. Although only seven vertical lines 826 are shown in the example 824, in implementations, a vertical line may extend through each vertex of the polygons created by the line 818, 820. In some examples, the operation 822 may include performing a horizontal binary search, e.g., a point-in-polygon search, to determine the vertical section in which the position 812 is located. As illustrated in the example 824, the position 812 is in a vertical section 828.

At operation 830, the process 800 may include identifying a lane of the entity based on the position in the vertical section. An example 832 accompanying the operation 830 shows the vertical section 828 determined by the operation 822. The vertical section 826 includes a number non-intersecting lines, e.g., segments of the lines 818, 820 extending between opposite, vertical sides of the section 828. Because the lines do not intersect, they create a plurality of vertically-arranged polygons in the section 828. In examples in which the lines 818 align with the lane divides, each of the polygons also lies completely within a traffic lane. Accordingly, the operation 830 can determine the lane in which the position 812 is located by determining the polygon in which the position 812 is located. In some examples, the operation 830 can include performing a vertical binary search, e.g., a point-in-polygon search, to determine that the location is in the portion 834 of the vertical section 828. Thus, in the example, the position 812 is determined to be located in the second lane 810(2), shown in the example 804.

As noted above, the processes 800, 800 can be used together to locate entities in a mapped region. In examples, determining the location may promote construction and/or updating of directional graphs using techniques described herein. In some instances, the directional graphs described herein may also include or have associated distance information. In some examples, such distances may be distances in a frame of reference associated with individual road segments and/or vehicle-centric coordinate systems.

Accordingly, in some examples, techniques described herein can transform a location of an entity from a global coordinate system, e.g., an x,y coordinate system or map-based coordinate system, to a road segment- or segment-centric coordinate system. An example of a segment-centric coordinate system may be an s, t coordinate system. In some examples, the s,t coordinate system can be a two-dimensional coordinate system in which s represents a distance along a reference line and t represents an offset from the reference line. In examples of an autonomous vehicle, the reference line may be a line through a traffic lane, e.g., bisecting a travel path of the vehicle. Thus, the reference "line" may, in fact include arcs, bends, straight sections, or the like, e.g., depending upon the contours of the road segment. In a relatively straight section of road, such as the road segment 808 illustrated in FIG. 8, the reference line may be a relatively straight line. Thus, for an autonomous vehicle also travelling in the second lane 810(2) in the example of FIG. 8, the position 812 may be located at a coordinate (s, 0), where s represents the distance of the position 812 (and thus the entity associated with the position 812) from the autonomous vehicle along the reference line, which, as noted above, may not be a straight-line distance. Continuing with the example, if the autonomous vehicle is located in the first lane 810(1), the position 812 may be located at a coordinate (s,t), where s is the distance in the lane and t is an offset associated with the first lane 810(1) and the second lane 810(2).

In contrast, in a curved segment, like the segment 210(4) shown in FIG. 2, the reference line may a center line of the curved segment, thereby curving also. Thus, a position in the segment 210(4) may be represented in the s, t coordinate system such that s is a distance along the curved reference line and t is an offset relative to the reference line.

Figure 9:
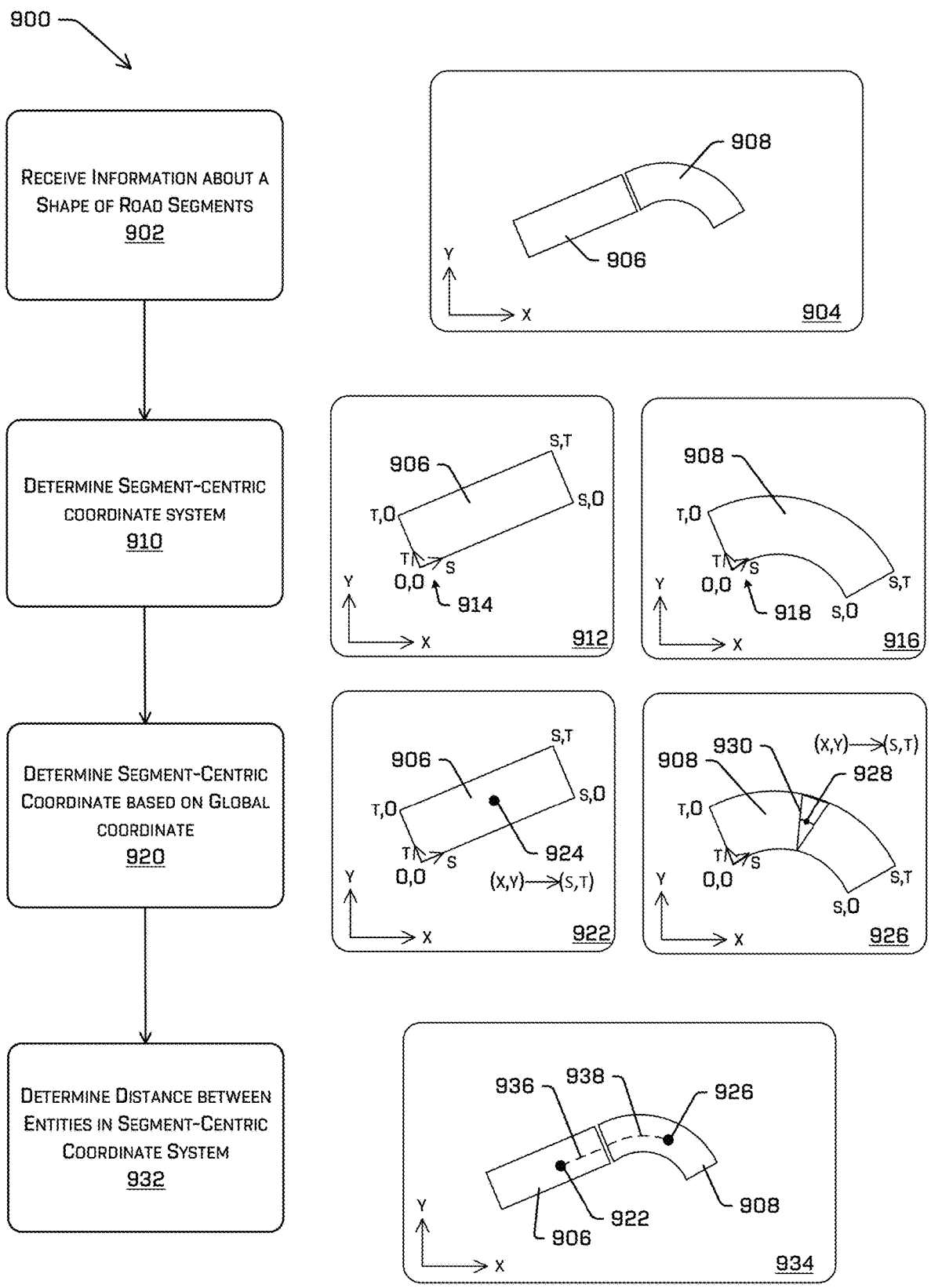
FIG. 9 includes textual and visual flowcharts to illustrate a process for determining information about connected entities in a segment-centric coordinate system, according to aspects of this disclosure.

FIG. 9 is a flowchart showing an example method involving transforming positions from a global position system to a vehicle-oriented or road-segment oriented reference frame. Specifically, FIG. 9 illustrates textual and pictorial flowcharts demonstrative of a process 900 in which a global coordinate, e.g., an x,y coordinate, is transformed into a segment-centric or track coordinate, e.g., an s,t coordinate. For instance, the process 900 may be used to determine distances between entities in the segment-centric coordinate system. The method illustrated in FIG. 9 is described with reference to examples provided herein for convenience and ease of understanding. However, the process 900 is not limited to use with examples described herein, and can be implemented using any of the other techniques described herein, as well as techniques other than those described herein. Moreover, the techniques described herein are not limited to performing the process 900.

The process 900, as with portions of the processes 200, 300, 400, 500, 600, 700, 800 is illustrated as a collection of blocks in a logical flow graph, which represents a sequence of operations that can be implemented in hardware, software, or a combination thereof. In the context of software, the blocks represent computer-executable instructions stored on one or more computer-readable storage media that, when executed by processor(s), perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes. In some embodiments, one or more blocks of the process can be omitted entirely. Moreover, the process 900 can be combined in whole or in part with other methods.

At operation 902, the process 900 can include receiving information about a shape of one or more road segments. For example, map data, such as map data described herein, can include information about the extents, shape, attributes, or the like of road segments. In some examples, the road segment may be a single travel lane of a number of travel lanes, or in other examples, the road segment may include a number of lanes, which may be configured to facilitate travel in the same or different directions. An example 904 accompanying the operation 902 shows a first lane segment 906 and a second lane segment 908 as example road segments.

At operation 910, the process 900 can include determining a segment-centric coordinate system. For example, the segment-centric coordinate system can be a per-segment coordinate system. A first example 912 accompanying the operation 910 illustrates a segment-centric coordinate frame 914 for the first road segment 906 and a second example 916 illustrates a segment-centric coordinate frame 918 for the second road segment 908. As illustrated, the coordinate frames 914, 918 are s,t coordinate frames, in which s is a dimension extending generally along a reference line coinciding with a direction of travel in the segment and t is an offset from the reference line. More specifically, the s-dimension may be a line travelling generally along the road segment, e.g., from a point or end of ingress associated with the road segment to a point or end of egress associated with the road segment. In examples in which the road segment is relatively straight, e.g., the road segment 906, the s-dimension may also be relatively straight, however, in instances in the road segment has curves, bends, or the like, e.g., the road segment 908, the s-dimension will include similar curves, bends, or the like. In some examples, the s-dimension may extend from an origin (illustrated at 0,0) in the examples 912, 916), at a position associated with a point or end of ingress to the road segment, in a direction s to a point or end of egress of the road segment. Thus, for instance, the origin of the reference line may also serve as an origin of a local or track coordinate system, e.g., an s,t coordinate system. In examples, point along the reference line will have the location (s,0) whereas points off the reference line will have a coordinate (s,t) where t is a distance (e.g., a lateral or normal distance) from the reference line. In the example, the reference line described is illustrated as a side of the road segment, however in other implementations, the reference line may be approximately centrally-located in the road segment, e.g., to coincide with a likely position of a vehicle in the road segment, e.g., when the road segment includes a single lane of travel.

At operation 920, the process 900 includes determining a segment-centric coordinate based on a global coordinate. For example and as described above, a position associated with an entity may be determined in a global coordinate system. For instance, a sensor on a vehicle can generate sensor data that facilitates the vehicle to determine a relative, or local position of entities relative to the vehicle. Moreover, because a vehicle computing system can localize the vehicle in a global-coordinate system, e.g., a map-based coordinate system, the vehicle computing system may also determine a position of the entity in the global coordinate system. Moreover, as noted above, the techniques described with reference to FIGS. 7 and 8 may determine road and/or lane segments associated with entities based on these global coordinates. However, for planning at the autonomous vehicle, a segment-based coordinate system, such as the s,t coordinate system may be useful. A first example 922 accompanying the operation 920 shows a first position 924 of a first entity on the first road segment 906 and a second example 926 accompanying the operation 920 shows a second position 928 of a second entity on the second road segment 908. The operation 920 determines the s,t coordinates for the first position 924 and the second position 928, given the known x,y global coordinates.

In the first example 922, in which the road segment 906 is a relatively straight road segment, an x,y position of an entity can be transformed into an s,t coordinate using a relatively simple transform in which the origin of the s,t coordinate system is associated with an x,y position and the difference in x and y can be used to determine the distance s and any offset, t. For example, a transform for finding a position s,t given an x,y coordinate may include:

$$dt = -dx \sin(\theta) + dy \cos(\theta) \quad (1)$$

$$ds = dx \cos(\theta) + dy \sin(\theta) \quad (2)$$

$$t = dt + t_0 \quad (3)$$

$$s = ds + s_0 \quad (4)$$

where $dx = x - x_0$ and $dy = y - y_0$, where $(x_0, y_0)$ represents an origin of the global coordinate system, $(s_0, t_0)$ represents an origin of the segment-centric coordinate system, and $\theta$ represents an angle, e.g., a yaw angle, between the coordinate systems (e.g., which may be of the vehicle).

However, in curved road segments, as in the second example 926, the transform may not be so straightforward, e.g., because the reference line of the s,t-coordinate system is not linear. In such examples, the operation 920 may use the triangle similarity theorem to approximate a section of the curved road segment as a triangle and scaling the distance s according to the offset t. Such an approximation is illustrated by the reference numeral 930. In some instances, the triangle similarity theorem may locate points with an accuracy of 0.05 meters or less in curved road segments. In some examples, a transform may include:

$$dt = -dx \sin(\theta) + dy \cos(\theta) \quad (5)$$

$$ds = [dx \cos(\theta) + dy \sin(\theta)] \left\| \frac{c_t - t}{c_t - (dt + t)} \right\| \quad (6)$$

$$t = dt + t_0 \quad (7)$$

$$s = ds + s_0 \quad (8)$$

where $dx = x - x_0$ and $dy = y - y_0$ where $(x_0, y_0)$ represents an origin of the global coordinate system, $(s_0, t_0)$ represents an origin of the segment-centric coordinate system, $\theta$ represents an angle, e.g., a yaw angle, between the coordinate systems, and $c_t$ is a center of curvature for the route segment.

At operation 932, the process 900 can include, determining distances between entities in the segment-centric coordinate system. For instance, using techniques described herein, vehicles in an environment can be linked based on their locations in the same lane segments and/or potential locations along a path including the lane segment of a leading vehicle. The segment-centric coordinate system may be used to better understand (and express) distances between such entities. For example, two vehicles in a same road segment that are 2 meters apart may have coordinates (2, 0) and (4,0), respectively, regardless of the shape or contour of the lane segment. Similarly, distances between vehicles in different lane segments can be readily determined, as the reference lines for each of the segments will be aligned for successive lane segments. In some examples, because vehicles in the lane may be assumed to be generally travelling within the bounds of the lane, the offset parameter, t, can be ignored completely, such that distances between connected entities can be expressed as a one-dimensional value. In the example 934 accompanying the operation 932, the distance between the first entity at the first position 924 and the second entity at the second position 928 is the sum of the "length" of a segment 936 in the first segment 906 and the "length" of a segment 938 in the second segment 908, where each "length" is a distance along the s-dimension.

Figure 10:
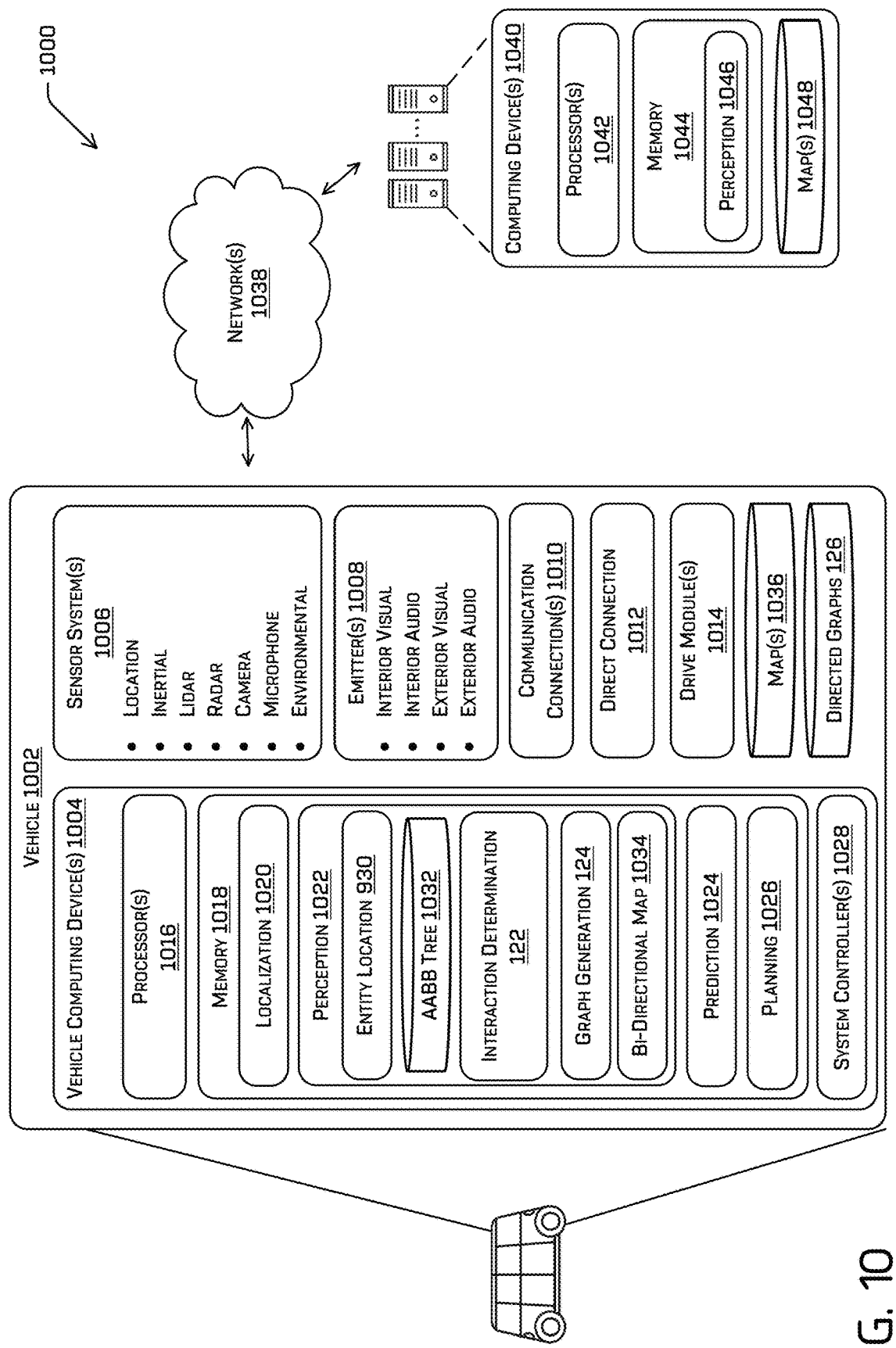
FIG. 10 is a block diagram illustrating example vehicle and remote computing systems for vehicle control using directed graphs, according to aspects of this disclosure.

FIG. 10 includes is a block diagram illustrating an example system 1000 for implementing responsive control of a vehicle through an environment as described herein. In at least one example, the system 1000 can include a vehicle 1002, which can be the same as the vehicle 102 described above with reference to FIG. 1. The vehicle 1002 can include one or more vehicle computing devices 1004, one or more sensor systems 1006, one or more emitters 1008, one or more communication connections 1010, at least one direct connection 1012, and one or more drive modules 1014. In at least one example, the vehicle computing device(s) 1004 can correspond to the vehicle computing device(s) 116 described above with reference to FIG. 1.

The vehicle computing device(s) 1004 can include processor(s) 1016 and memory 1018 communicatively coupled with the processor(s) 1016. In the illustrated example, the vehicle 1002 is an autonomous vehicle; however, the vehicle 1002 could be any other type of vehicle. In the illustrated example, the memory 1018 of the vehicle computing device(s) 1004 stores a localization system 1020, a perception system 1022, a prediction system 1024, a planning system 1026, and one or more system controllers 1028. Although these systems and components are illustrated, and will be described below, as separate components for ease of understanding, functionality of the various systems, components, and controllers may be attributed differently than discussed. By way of non-limiting example, functionality attributed to the perception system 1022 may be carried out by the localization system 1020 and/or the prediction system 1024. Fewer or more systems and components may be utilized to perform the various functionalities described herein. Furthermore, though depicted in FIG. 2 as residing in memory 1018 for illustrative purposes, it is contemplated that the localization system 1020, the perception system 1022, the prediction system 1024, the planning system 1026, and/or the one or more system controllers 1028 can additionally, or alternatively, be accessible to the vehicle 1002 (e.g., stored on, or otherwise accessible by, memory remote from the vehicle 1002).

In at least one example, the localization system 1020 can include functionality to receive data from the sensor system(s) 1006 to determine a position and/or orientation of the vehicle 1002 (e.g., one or more of an x-, y-, z-position, roll, pitch, or yaw). For example, the localization system 1020 can include and/or request/receive a map of an environment (e.g., from the map storage 1036) and can continuously determine a location and/or orientation of the vehicle 1002 within the map. In some instances, the localization system 1020 can utilize simultaneous localization and mapping (SLAM) techniques, calibration, localization and mapping, simultaneously, techniques, relative SLAM techniques, bundle adjustment, non-linear least squares optimization, differential dynamic programming, or the like to receive image data, LIDAR data, radar data, IMU data, GPS data, wheel encoder data, and the like to accurately determine a location of the autonomous vehicle. In some instances, the localization system 1020 can provide data to various components of the vehicle 1002 to determine an initial position of an autonomous vehicle for generating a candidate trajectory for travelling in the environment.

In some instances, the perception system 1022 can include functionality to perform object detection, segmentation, and/or classification. In some examples, the perception system 1022 can provide processed sensor data that indicates a presence of an object that is proximate to the vehicle 1002, such as the additional vehicles 112. The perception system 1022 may also determine a classification of the entity as an entity type (e.g., car, pedestrian, cyclist, animal, building, tree, road surface, curb, sidewalk, unknown, etc.). For instance, the perception system 1022 may compare sensor data to stored object information to determine the classification. In additional and/or alternative examples, the perception system 1022 can provide processed sensor data that indicates one or more characteristics associated with a detected object and/or the environment in which the object is positioned. In some examples, characteristics associated with an object can include, but are not limited to, an x-position (global and/or local position), a y-position (global and/or local position), a z-position (global and/or local position), an orientation (e.g., a roll, pitch, yaw), an object type (e.g., a classification), a velocity of the object, an acceleration of the object, an extent of the object (size), etc. Characteristics associated with the environment can include, but are not limited to, a presence of another object in the environment, a state of another object in the environment, a time of day, a day of a week, a season, a weather condition, an indication of darkness/light, etc.

In implementations of this disclosure, and in more detail, the perception system 1022 may identify objects in an environment, generate graphs representing vehicle/entity interactions and/or associations, locate entities in a mapped environment, and/or associate entities. For instance, and as illustrated in FIG. 10, the perception system 1022 may include an entity location component 1030 (which may be the same as or similar to the entity location component 120), an AABB tree 1032, the interaction determination component 122, the graph generation component 124, and/or a bidirectional map component 1034.

The entity location component 1030 can include functionality to determine locations of entities in a mapped region. In some examples, the entity location component 1030 can receive (or otherwise determine) coordinates of an entity on a drivable surface, e.g., based on sensor data from the sensor system(s) 1006. In some examples, the location of the entity may correspond to a segment of the mapped region, such as a road segment, a lane segment, or the like. The entity location component 1030 can determine the position of the entity in the mapped region by querying a data structure associated with the mapped region. In at some examples, such as those described herein with reference to FIG. 7, the entity location component 1030 can query the AABB tree 1032 to determine a road segment (such as a connecting road or a junction) in which an entity is located. Also in examples, such as those described herein with reference to FIG. 8, the entity location component 1030 can also include functionality to partition or section a road segment, e.g., into polygons and to implement binary searches to determine a position within a road segment.

Also in examples, the entity location component 1030 can include functionality to determine a location of an entity in different coordinate systems. By way of non-limiting example, the entity location component 1030 can implement the process 800 to transform a coordinate in a global, e.g., map-based, x-y, or the like, coordinate system, to a vehicle-centric or track-based coordinate system. For instance, the entity location component 1030 can implement one or more transforms, including but not limited to those discussed above in connection with FIG. 10.

The interaction determination component 122 was described above in connection with FIG. 1. Generally, the interaction determination component 122 can include functionality to receive entity location information, e.g., from the entity location component 1030, and associate entities based on such information. In examples described herein, such associations may be based on the entities being in the same lane of travel and/or in lanes that the following vehicle may travel through.

The graph generation component 124 was described above in connection with FIG. 1. Generally, the graph generation component 124 can include functionality to generate one or more data structures based on the associations determined by the interaction determination component 122. In some examples, the graph generation component 124 may generate the directed graphs 126 which represent entities as nodes and use edges to connect related nodes.

The bidirectional map component 1034 can include functionality to generate, access, and/or otherwise interact with one or more bidirectional maps. For example, the bidirectional map component 1034 can include functionality to implement some or all of process 500. As detailed with reference to FIG. 5, the process 500 uses a bidirectional map for updating a directed graph, such as one of the directed graphs 126.

The prediction system 1024 can access sensor data from the sensor system(s) 1006, map data from a map storage 1036, and, in some examples, perception data output from the perception system 1022 (e.g., processed sensor data). In at least one example, the prediction system 1024 can determine features associated with the object based at least in part on the sensor data, the map data, and/or the perception data. As described above, features can include an extent of an object (e.g., height, weight, length, etc.), a pose of an object (e.g., x-coordinate, y-coordinate, z-coordinate, pitch, roll, yaw), a velocity of an object, an acceleration of an object, and a direction of travel of an object (e.g., a heading). Moreover, the prediction system 1024 may be configured to determine a distance between an object and a proximate driving lane, a width of a current driving lane, proximity to a crosswalk, semantic feature(s), interactive feature(s), etc.

The prediction system 1024 can also analyze features of objects to predict future actions of the objects. For instance, the prediction system 1024 can predict lane changes, decelerations, accelerations, turns, changes of direction, or the like. The prediction system 1024 can send prediction data to the planning system 1026, e.g., so that the request generation system 1030 can, using the prediction data, determine an appropriate action for controlling the vehicle 1002 relative to an object. For instance, the prediction system 1024 can generate prediction data indicative of a likelihood that an object will enter a travel path and/or otherwise interfere with a current path and/or trajectory of the vehicle 1002. In examples described herein, the prediction system 1024 can access the directed graphs 126 to identify relevant entities for which prediction data should be determined.

In general, the planning system 1026 can determine a path along which the vehicle 1002 can traverse through an environment. For example, the planning system 1026 can determine various routes and trajectories and various levels of detail. The planning system 1026 can determine a route to travel from a first location (e.g., a current location) to a second location (e.g., a target location). For the purpose of this discussion, a route can be a sequence of waypoints for travelling between two locations. As non-limiting examples, waypoints include streets, intersections, global positioning system (GPS) coordinates, etc. Further, the planning system 1026 can generate an instruction for guiding the autonomous vehicle along at least a portion of the route from the first location to the second location. In at least one example, the planning system 1026 can determine how to guide the autonomous vehicle from a first waypoint in the sequence of waypoints to a second waypoint in the sequence of waypoints. In some examples, the instruction can be a trajectory, or a portion of a trajectory. In some examples, multiple trajectories can be substantially simultaneously generated (e.g., within technical tolerances) in accordance with a receding horizon technique, wherein one of the multiple trajectories is selected for the vehicle 1002 to navigate. Thus, in example implementations described herein, the planning system 1026 may generate trajectories along which the vehicle can navigate, with the trajectories being along a travel path.

In at least one example, the localization system 1020, the perception system 1022 (and/or the components of the perception system 1022), the prediction system 1024, and/or the planning system 1026 can process sensor data, as described above, and can send their respective outputs over network(s) 1038, to computing device(s) 1040. In at least one example, the localization system 1020, the perception system 1022, the prediction system 1024, and/or the planning system 1026 can send their respective outputs to the computing device(s) 1040 at a particular frequency, after a lapse of a predetermined period of time, in near real-time, etc.

In at least one example, the vehicle computing device(s) 1004 can also include the system controllers 1028, which can be configured to control steering, propulsion, braking, safety, emitters, communication, and other systems of the vehicle 1002. These system controller(s) 1028 can communicate with and/or control corresponding systems of the drive module(s) 1014 and/or other components of the vehicle 1002. For example, the system controller(s) 1028 may cause the vehicle to traverse along a drive path determined by the planning system 1026.

In at least one example, the sensor system(s) 1006 can include LIDAR sensors, RADAR sensors, ultrasonic transducers, SONAR sensors, location sensors (e.g., GPS, compass, etc.), inertial sensors (e.g., inertial measurement units, accelerometers, magnetometers, gyroscopes, etc.), cameras (e.g., RGB, UV, IR, intensity, depth, etc.), microphones, wheel encoders, environment sensors (e.g., temperature sensors, humidity sensors, light sensors, pressure sensors, etc.), etc. The sensor system(s) 1006 can include multiple instances of each of these or other types of sensors. For instance, the LIDAR sensors can include individual LIDAR sensors located at the corners, front, back, sides, and/or top of the vehicle 1002. As another example, the camera sensors can include multiple cameras disposed at various locations about the exterior and/or interior of the vehicle 1002. The sensor system(s) 1006 can provide input to the vehicle computing device(s) 1004. Additionally and/or alternatively, the sensor system(s) 1006 can send sensor data, via the network(s) 1038, to the computing device(s) 1040 at a particular frequency, after a lapse of a predetermined period of time, in near real-time, etc.

The vehicle 1002 can also include the emitter(s) 1008 for emitting light and/or sound. The emitter(s) 1008 in this example can include interior audio and visual emitters to communicate with passengers of the vehicle 1002. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 1008 in this example also include exterior emitters. By way of example and not limitation, the exterior emitters can include light emitters (e.g., indicator lights, signs, light arrays, etc.) to visually communicate with pedestrians, other drivers, other nearby vehicles, etc., one or more audio emitters (e.g., speakers, speaker arrays, horns, etc.) to audibly communicate with pedestrians, other drivers, other nearby vehicles, etc., or the like. In at least one example, the emitter(s) 1008 can be disposed at various locations about the exterior and/or interior of the vehicle 1002.

The vehicle 1002 can also include the communication connection(s) 1010 that enable communication between the vehicle 1002 and other local or remote computing device(s). For instance, the communication connection(s) 1010 can facilitate communication with other local computing device(s) on the vehicle 1002 and/or the drive module(s) 1014. Also, the communication connection(s) 1010 can allow the vehicle to communicate with other nearby computing device(s) (e.g., other nearby vehicles, traffic signals, etc.). The communications connection(s) 1010 also enable the vehicle 1002 to communicate with a remote teleoperations computing device or other remote services. The communications connection(s) 1010 can include physical and/or logical interfaces for connecting the vehicle computing device(s) 1004 to another computing device or a network, such as network(s) 1038. For example, the communications connection(s) 1010 can enable Wi-Fi-based communication such as via frequencies defined by the IEEE 802.11 standards, short range wireless frequencies such as BLUETOOTH®, or any suitable wired or wireless communications protocol that enables the respective computing device to interface with the other computing device(s).

In at least one example, the vehicle 1002 can also include the drive module(s) 1014. In some examples, the vehicle 1002 can have a single drive module 1014. In at least one example, if the vehicle 1002 has multiple drive modules 1014, individual drive modules 1014 can be positioned on opposite ends of the vehicle 1002 (e.g., the front and the rear, etc.). In at least one example, the drive module(s) 1014 can include sensor system(s) to detect conditions of the drive module(s) 1014 and/or the surroundings of the vehicle 1002. By way of example and not limitation, the sensor system(s) 1006 can include wheel encoder(s) (e.g., rotary encoders) to sense rotation of the wheels of the drive module, inertial sensors (e.g., inertial measurement units, accelerometers, gyroscopes, magnetometers, etc.) to measure position and acceleration of the drive module, cameras or other image sensors, ultrasonic sensors to acoustically detect objects in the surroundings of the drive module, LIDAR sensors, RADAR sensors, etc. Some sensors, such as the wheel encoder(s) can be unique to the drive module(s) 1014. In some cases, the sensor system(s) on the drive module(s) 1014 can overlap or supplement corresponding systems of the vehicle 1002 (e.g., the sensor system(s) 1006).

The drive module(s) 1014 can include many of the vehicle systems, including a high voltage battery, a motor to propel the vehicle 1002, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive module(s) 1014 can include a drive module controller which can receive and preprocess data from the sensor system(s) and to control operation of the various vehicle systems. In some examples, the drive module controller can include processor(s) and memory communicatively coupled with the processor(s). The memory can store one or more modules to perform various functionalities of the drive module(s) 1014. Furthermore, the drive module(s) 1014 also include communication connection(s) that enable communication by the respective drive module with other local or remote computing device(s).

As described above, the vehicle 1002 can send sensor data to the computing device(s) 1040, via the network(s) 1038. In some examples, the vehicle 1002 can send raw sensor data to the computing device(s) 1040. In other examples, the vehicle 1002 can send processed sensor data and/or representations of sensor data to the computing device(s) 1040 (e.g., data output from the localization system 1020, the perception system 1022, the prediction system 1024, and/or the planning system 1026). In some examples, the vehicle 1002 can send sensor data to the computing device(s) 1040 at a particular frequency, after a lapse of a predetermined period of time, in near real-time, etc.

The computing device(s) 1040 can receive the sensor data (raw or processed) from the vehicle 1002 and/or one or more other vehicles and/or data collection devices, and can perform drive planning functions, including some or all of the functions ascribed to the planning system 1026 and/or the perception system 1022. In at least one example, the computing device(s) 1040 can include processor(s) 1042 and memory 1044 communicatively coupled with the processor(s) 1042. In the illustrated example, the memory 1044 of the computing device(s) 1040 stores a perception component 1046 and one or more maps 1048, for example. In at least one example, the perception component 1046 can correspond to some or all of the perception system 1022 detailed above. The map(s) 1048 can correspond to the map(s) 1036.

The processor(s) 1016 of the vehicle 1002 and the processor(s) 1042 of the computing device(s) 1040 can be any suitable processor capable of executing instructions to process data and perform operations as described herein. By way of example and not limitation, the processor(s) 1016, 1042 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

Memory 1018, 1044 are examples of non-transitory computer-readable media. Memory 1018, 1044 can store an operating system and one or more software applications, instructions, programs, and/or data to implement the methods described herein and the functions attributed to the various systems. In various implementations, the memory can be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

While FIG. 10 is illustrated as a distributed system, in alternative examples, components of the vehicle 1002 can be associated with the computing device(s) 1040 and/or components of the computing device(s) 1040 can be associated with the vehicle 1002. That is, the vehicle 1002 can perform one or more of the functions associated with the computing device(s) 1040, and vice versa. Moreover, although various systems and components are illustrated as being discrete systems, the illustrations are examples only, and more or fewer discrete systems may perform the various functions described herein.

The various techniques described herein can be implemented in the context of computer-executable instructions or software, such as program modules, that are stored in computer-readable storage and executed by the processor(s) of one or more computers or other devices such as those illustrated in the figures. Generally, program modules include routines, programs, objects, components, data structures, etc., and define operating logic for performing particular tasks or implement particular abstract data types.

Other architectures can be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

Similarly, software can be stored and distributed in various ways and using different means, and the particular software storage and execution configurations described above can be varied in many different ways. Thus, software implementing the techniques described above can be distributed on various types of computer-readable media, not limited to the forms of memory that are specifically described.

EXAMPLE CLAUSES

A: An example autonomous vehicle includes: a sensor configured to generate sensor data; one or more processors; and memory storing processor-executable instructions that, when executed by the one or more processors, cause the autonomous vehicle to perform acts comprising: receiving map data associated with a drivable surface in an environment and on which the autonomous vehicle is traversing; receiving a vehicle route comprising a current traffic lane and one or more traffic lanes in which the autonomous vehicle will travel; determining, based at least in part on the sensor data, a first position of a first entity on the drivable surface and a second position of a second entity on the drivable surface; generating a directed graph based at least in part on the autonomous vehicle, the first entity, the second entity, the first position, the second position, the current traffic lane, and the one or more traffic lanes; determining, based at least in part on the directed graph, one or more controls for the autonomous vehicle for travelling along the vehicle route; and controlling the vehicle in accordance with the one or more controls.

B: The autonomous vehicle of example A, wherein determining the one or more controls comprises: determining, based at least in part on the directed graph, that the first entity impacts the vehicle route; modeling, based at least in part on the directed graph, a behavior of the first entity; and generating the one or more controls based at least in part on the behavior.

C: The autonomous vehicle of example A or example B, wherein the directed graph comprises a first node representing the autonomous vehicle, a second node representing the first entity, a third node representing the second entity, a first edge associating the first node with the second node, a second edge associating the first node with the third node, and a third edge associating the second node with the third node, and wherein modeling the behavior of the first entity comprises: determining, based at least in part on the third edge, a distance between the first entity and the second entity; determining, based at least in part on the sensor data, a velocity of the second entity; and determining, based at least in part on the one or more traffic lanes, a plurality of traffic controls, wherein the behavior is based at least in part on one or more of: the distance, the velocity, or the plurality of traffic controls.

D: The autonomous vehicle of any one of example A through example C, wherein the directed graph further comprises a third edge connecting the second node and the third node based at least in part on the first predicted route and the second predicted route, wherein the acts further comprise: determining, based at least in part on the sensor data, an updated position of the first entity; and removing the first edge and the third edge from the directed graph based at least in part on the updated position.

E: The autonomous vehicle of any one of example A through example D, the acts further comprising: generating, based at least in part on removing the first edge and the third edge, one or more updated controls at the exclusion of behaviors of the first entity.

F: The autonomous vehicle of any one of example A through example E, wherein the directed graph comprises: a first node representative of the vehicle and associated with the current traffic lane; a second node representative of the first entity and associated with a first traffic lane of the one or more traffic lanes; a third node representative of the second entity and associated with a second traffic lane of the one or more traffic lanes associated with the second position; a first edge connecting the first node and the second node, the first edge based at least in part on an autonomous vehicle route and a first predicted route of the first entity; and a second edge connecting the first node and the third node, the second edge based at least in part on the autonomous vehicle route and a second predicted route of the second entity.

G: An example method includes: receiving sensor data from a sensor on a vehicle; determining, based at least on the sensor data, a plurality of entities in an environment; associating the plurality of entities with one or more road segments representative of portions of a drivable surface in the environment; determining a vehicle road segment associated with the vehicle in the map; connecting, as nodes of a directed graph and based at least in part on the vehicle road segment and the one or more road segments, the vehicle and at least one of the plurality of entities; determining one or more controls for the autonomous vehicle based at least in part on the directed graph; and controlling the vehicle based at least in part on the controls.

H: The method of example G, wherein the directed graph comprises: a first node of the nodes associated with the vehicle; a second node of the nodes associated with a first entity of the at least one of the plurality of entities; and a first edge associating the first node and the second node, the method further comprising: determining, based at least in part on the directed graph, that the first entity impacts the vehicle route; modeling, based at least in part on the directed graph, a behavior of the first entity; and generating the one or more controls based at least in part on the behavior.

I: The method of example G or example H, wherein the directed graph further comprises: a third node of the nodes associated with a second entity of the plurality of entities; and a second edge associating the second node with the third node, the method further comprising: modeling, based at least in part on the directed graph, a second behavior of the second entity, wherein the modeling the behavior of the first entity is further based on the second behavior of the second entity.

J: The method of any one of example G through example I, further comprising: determining an updated position of the first entity; removing the first edge from the directed graph based at least in part on the updated position; and generating, based at least in part on removing the first edge, one or more updated controls for the vehicle at the exclusion of behaviors of the first entity.

K: The method of any one of example G through example J, wherein the directed graph further comprises: a third node of the nodes associated with a second entity of the plurality of entities, a fourth node of the nodes associated with a third entity of the plurality of entities, and a second edge associating the third node with the fourth node, wherein the second entity and the third entity are associated with at least one entity lane segment other than the one or more lane segments, wherein the generating the one or more controls is at the exclusion of behaviors associated with the second entity and the third entity.

L: The method of any one of example G through example K, wherein the updated position indicates that the first entity has moved from a first road segment of the one or more road segments to a second road segment of the one or more road segments, the method further comprising: accessing a bidirectional map containing one or more associations between the vehicle, the plurality of entities, the current vehicle road segment, and the one or more additional road segments; removing, from the bidirectional map and based at least in part on the updated position, a first association of the first entity with the first road segment; determining one or more of the vehicle or a second entity of the plurality of entities associated with the first road segment in the bidirectional map; and determining, from the directed graph, one or more associations of the second node with nodes representative of the one or more of the vehicle or the second entity.

M: The method of any one of example G through example L, further comprising: updating one or more edges representative of the one or more associations.

N: The method of any one of example G through example M, wherein the associating the plurality of entities with one or more road segments comprises querying a second data structure associated with a map of the environment.

O: The method of any one of example G through example N, wherein the second data structure comprises an axis-aligned bounding box (AABB) tree describing AABBs of road segments in the environment.

P: The method of any one of example G through example O, wherein the querying the AABB tree returns a road segment associated with the location, the method further comprising: sectioning the road segment into a plurality of polygonal sections; and performing a binary search on the plurality of polygonal sections to determine a lane in the road segment associated with the location.

Q: One or more non-transitory computer-readable media storing instructions that, when executed, cause one or more processors to perform operations comprising: receiving sensor data from a sensor on a vehicle; determining, based at least on the sensor data, a plurality of entities in an environment; associating the plurality of entities with one or more road segments representative of portions of a drivable surface in the environment; determining a vehicle road segment associated with the vehicle in the map; connecting, as nodes of a directed graph and based at least in part on the vehicle road segment and the one or more road segments, the vehicle and at least one of the plurality of entities; determining one or more controls for the autonomous vehicle based at least in part on the directed graph; and controlling the vehicle based at least in part on the controls.

R: The non-transitory computer-readable media of example Q, wherein the directed graph comprises: a first node of the nodes associated with the vehicle; a second node of the nodes associated with a first entity of the at least one of the plurality of entities; and a first edge associating the first node and the second node, the operations further comprising: determining, based at least in part on the directed graph, that the first entity impacts the vehicle route; modeling, based at least in part on the directed graph, a behavior of the first entity; and generating the one or more controls based at least in part on the behavior.

S: The non-transitory computer-readable media of example Q or example R, further comprising: determining an updated position of the first entity; removing the first edge from the directed graph based at least in part on the updated position; and generating, based at least in part on removing the first edge, one or more updated controls for the vehicle at the exclusion of behaviors of the first entity.

T: The non-transitory computer-readable media of any one of example Q through example S, wherein the updated position indicates that the first entity has moved from a first road segment of the one or more road segments to a second road segment of the one or more road segments, the operations further comprising: accessing a bidirectional map containing one or more associations between the vehicle, the plurality of entities, the current vehicle road segment, and the one or more additional road segments; removing, from the bidirectional map and based at least in part on the updated position, a first association of the first entity with the first road segment; determining one or more of the vehicle or a second entity of the plurality of entities associated with the first road segment in the bidirectional map; and determining, from the directed graph, one or more associations of the second node with nodes representative of the one or more of the vehicle or the second entity.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations described herein need not be performed in the order disclosed, and other examples using alternative orderings of the computations could be readily implemented. In addition to being reordered, in some instances, the computations could also be decomposed into sub-computations with the same results.

What is claimed is:

1. An autonomous vehicle comprising:
    a sensor configured to generate sensor data;
    one or more processors; and
    memory storing processor-executable instructions that, when executed by the one or more processors, cause the autonomous vehicle to perform acts comprising:
        receiving map data associated with a drivable surface in an environment and on which the autonomous vehicle is traversing;
        receiving a vehicle route comprising a current traffic lane and one or more traffic lanes in which the autonomous vehicle will travel;
        determining, based at least in part on the sensor data, a first position of a first entity on the drivable surface and a second position of a second entity on the drivable surface;
        generating a directed graph based at least in part on the autonomous vehicle, the first entity, the second entity, the first position, the second position, the current traffic lane, and the one or more traffic lanes;
        determining, based at least in part on the directed graph, that the first entity impacts the vehicle route and that the second entity impacts travel of the first entity;
        predicting, based on one or more attributes of the second entity and at least in part on the second entity impacting the travel of the first entity, a predicted behavior of the first entity;
        determining, based at least in part on the predicted behavior of the first entity, one or more controls for the autonomous vehicle for driving along the vehicle route; and
        controlling the vehicle to drive along the vehicle route in accordance with the one or more controls.

2. The autonomous vehicle of claim 1, wherein determining the one or more controls comprises:
    modeling, based at least in part on the directed graph, the behavior of the first entity.

3. The autonomous vehicle of claim 2, wherein the directed graph comprises a first node representing the autonomous vehicle, a second node representing the first entity, a third node representing the second entity, a first edge associating the first node with the second node, a second edge associating the first node with the third node, and a third edge associating the second node with the third node, and wherein modeling the behavior of the first entity comprises:
    determining, based at least in part on the third edge, a distance between the first entity and the second entity;
    determining, based at least in part on the sensor data, a velocity of the second entity; and
    determining, based at least in part on the one or more traffic lanes, a plurality of traffic controls,
    wherein the behavior is based at least in part on one or more of:

the distance,
the velocity, or
the plurality of traffic controls.

4. The autonomous vehicle of claim 3, wherein the third edge is based at least in part on the first predicted route and the second predicted route,
wherein the acts further comprise:
determining, based at least in part on the sensor data, an updated position of the first entity; and
removing the first edge and the third edge from the directed graph based at least in part on the updated position.

5. The autonomous vehicle of claim 4, the acts further comprising:
generating, based at least in part on removing the first edge and the third edge, one or more updated controls at the exclusion of behaviors of the first entity.

6. The autonomous vehicle of claim 1,
wherein the directed graph comprises:
a first node representative of the vehicle and associated with the current traffic lane;
a second node representative of the first entity and associated with a first traffic lane of the one or more traffic lanes;
a third node representative of the second entity and associated with a second traffic lane of the one or more traffic lanes associated with the second position;
a first edge connecting the first node and the second node, the first edge based at least in part on an autonomous vehicle route and a first predicted route of the first entity; and
a second edge connecting the first node and the third node, the second edge based at least in part on the autonomous vehicle route and a second predicted route of the second entity.

7. A method comprising:
receiving sensor data from a sensor on a vehicle;
determining, based at least on the sensor data, a plurality of entities in an environment;
associating the plurality of entities with one or more road segments representative of portions of a drivable surface in the environment;
determining a vehicle road segment associated with the vehicle in the map;
connecting, as nodes of a directed graph and based at least in part on the vehicle road segment and the one or more road segments, the vehicle and at least a first entity of the plurality of entities and a second entity of the plurality of entities;
determining, based at least in part on the directed graph, that the first entity impacts the vehicle route and that the second entity impacts travel of the first entity;
predicting, based on one or more attributes of the second entity and at least in part on the second entity impacting the travel of the first entity, a predicted behavior of the first entity;
determining, based at least in part on the predicted behavior of the first entity, one or more controls for controlling the vehicle to travel relative to the first entity and the second entity; and
controlling the vehicle to drive relative to the first entity and the second entity based at least in part on the controls.

8. The method of claim 7, wherein the directed graph comprises:
a first node of the nodes associated with the vehicle;
a second node of the nodes associated with the first entity of the at least one of the plurality of entities; and
a first edge associating the first node and the second node.

9. The method of claim 8, wherein the directed graph further comprises:
a third node of the nodes associated with the second entity of the plurality of entities; and
a second edge associating the second node with the third node, the method further comprising:
modeling, based at least in part on the directed graph, a second behavior of the second entity,
wherein the modeling the behavior of the first entity is further based on the second behavior of the second entity.

10. The method of claim 8, further comprising:
determining an updated position of the first entity;
removing the first edge from the directed graph based at least in part on the updated position; and
generating, based at least in part on removing the first edge, one or more updated controls for the vehicle at the exclusion of behaviors of the first entity.

11. The method of claim 8, wherein the directed graph further comprises:
a third node of the nodes associated with the second entity of the plurality of entities,
a fourth node of the nodes associated with a third entity of the plurality of entities, and
a second edge associating the third node with the fourth node,
wherein the second entity and the third entity are associated with at least one entity lane segment other than the one or more lane segments, wherein the generating the one or more controls is at the exclusion of behaviors associated with the second entity and the third entity.

12. The method of claim 10, wherein the updated position indicates that the first entity has moved from a first road segment of the one or more road segments to a second road segment of the one or more road segments, the method further comprising:
accessing a bidirectional map containing one or more associations between the vehicle, the plurality of entities, the current vehicle road segment, and the one or more additional road segments;
removing, from the bidirectional map and based at least in part on the updated position, a first association of the first entity with the first road segment;
determining one or more of the vehicle or the second entity of the plurality of entities associated with the first road segment in the bidirectional map; and
determining, from the directed graph, one or more associations of the second node with nodes representative of the one or more of the vehicle or the second entity.

13. The method of claim 12, further comprising:
updating one or more edges representative of the one or more associations.

14. The method of claim 7, wherein the associating the plurality of entities with one or more road segments comprises querying a second data structure associated with a map of the environment.

15. The method of claim 14, wherein the second data structure comprises an axis-aligned bounding box (AABB) tree describing AABBs of road segments in the environment.

16. The method of claim 15, wherein the querying the AABB tree returns a road segment associated with the location, the method further comprising:

sectioning the road segment into a plurality of polygonal sections; and performing a binary search on the plurality of polygonal sections to determine a lane in the road segment associated with the location.

17. One or more non-transitory computer-readable media storing instructions that, when executed, cause one or more processors to perform operations comprising:

receiving sensor data from a sensor on a vehicle;

determining, based at least on the sensor data, a plurality of entities in an environment;

associating the plurality of entities with one or more road segments representative of portions of a drivable surface in the environment;

determining a vehicle road segment associated with the vehicle in the map;

connecting, as nodes of a directed graph and based at least in part on the vehicle road segment and the one or more road segments, the vehicle and at least a first entity of the plurality of entities and a second entity of the plurality of entities;

determining, based at least in part on the directed graph, that the first entity impacts the vehicle route and that the second entity impacts travel of the first entity;

predicting, based on one or more attributes of the second entity and at least in part on the second entity impacting the travel of the first entity, a predicted behavior of the first entity;

determining, based at least in part on the predicted behavior of the first entity, one or more controls for controlling the vehicle to travel relative to the first entity and the second entity; and controlling the vehicle based at least in part on the controls.

18. The non-transitory computer-readable media of claim 17, wherein the directed graph comprises:

a first node of the nodes associated with the vehicle;

a second node of the nodes associated with the first entity of the at least one of the plurality of entities; and a first edge associating the first node and the second node.

19. The non-transitory computer-readable media of claim 18, further comprising:

determining an updated position of the first entity;

removing the first edge from the directed graph based at least in part on the updated position; and generating, based at least in part on removing the first edge, one or more updated controls for the vehicle at the exclusion of behaviors of the first entity.

20. The non-transitory computer-readable media of claim 17, wherein the updated position indicates that the first entity has moved from a first road segment of the one or more road segments to a second road segment of the one or more road segments, the operations further comprising:

accessing a bidirectional map containing one or more associations between the vehicle, the plurality of entities, the current vehicle road segment, and the one or more additional road segments;

removing, from the bidirectional map and based at least in part on the updated position, a first association of the first entity with the first road segment;

determining one or more of the vehicle or the second entity of the plurality of entities associated with the first road segment in the bidirectional map; and determining, from the directed graph, one or more associations of the second node with nodes representative of the one or more of the vehicle or the second entity.

* * * * *